United States Patent
Maruyama et al.

(10) Patent No.: US 11,319,388 B2
(45) Date of Patent: May 3, 2022

(54) RADIATION-SENSITIVE RESIN COMPOSITION, PRODUCTION METHOD THEREOF, AND RESIST PATTERN-FORMING METHOD

(71) Applicant: JSR CORPORATION, Tokyo (JP)

(72) Inventors: Ken Maruyama, Tokyo (JP); Yoshiki Nonoyama, Tokyo (JP); Takuo Sone, Tokyo (JP); Motohiro Shiratani, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 17/013,716

(22) Filed: Sep. 7, 2020

(65) Prior Publication Data

US 2020/0407476 A1    Dec. 31, 2020

Related U.S. Application Data

(63) Continuation of application No. PCT/JP2019/007675, filed on Feb. 27, 2019.

(30) Foreign Application Priority Data

Mar. 8, 2018    (JP) .............................. JP2018-041960

(51) Int. Cl.

| | | |
|---|---|---|
| *C08F 2/46* | (2006.01) | |
| *C08F 2/50* | (2006.01) | |
| *C08G 61/04* | (2006.01) | |
| *C08F 220/18* | (2006.01) | |
| *C08K 5/357* | (2006.01) | |
| *C08K 5/375* | (2006.01) | |
| *C08L 33/10* | (2006.01) | |
| *G03F 7/038* | (2006.01) | |

(52) U.S. Cl.

CPC .............. *C08F 220/18* (2013.01); *C08F 2/50* (2013.01); *C08K 5/357* (2013.01); *C08K 5/375* (2013.01); *C08L 33/10* (2013.01); *G03F 7/0388* (2013.01); *C08F 2438/01* (2013.01); *C08F 2438/02* (2013.01); *C08F 2438/03* (2013.01)

(58) Field of Classification Search

CPC .............. C08F 220/1818; C08F 220/18; C08F 220/1807; C08F 220/20; C08F 220/365; C08F 2/50; C08F 2/38; C08F 2438/01; C08F 2438/02; C08F 2438/03; C08F 212/22; C08K 5/357; C08K 5/375; C08K 5/42; C08K 5/435; C08K 5/09; C08K 5/372; C08L 33/10; G03F 7/0388; G03F 7/0397

USPC ........... 522/59, 49, 6, 71, 189, 184, 1; 520/1
See application file for complete search history.

(56) References Cited

U.S. PATENT DOCUMENTS

| | | | |
|---|---|---|---|
| 4,910,122 A | 3/1990 | Arnold et al. | |
| 6,200,728 B1 * | 3/2001 | Cameron | G03F 7/0045 430/270.1 |

FOREIGN PATENT DOCUMENTS

| | | |
|---|---|---|
| EP | 0159428 A1 | 10/1985 |
| JP | S59-93448 A | 5/1984 |
| JP | 05188598 A | 7/1993 |
| JP | H6-12452 A | 1/1994 |
| JP | 2009098687 A | 5/2009 |
| JP | 2009102659 A | 5/2009 |
| JP | 2016186079 A | 10/2016 |
| JP | 2017181696 | * 10/2017 |
| JP | 2017181696 A | 10/2017 |
| WO | WO-2018194123 A1 | 10/2018 |

OTHER PUBLICATIONS

Miyata, JP 2017-181696 Machine Translation, Oct. 5, 2017 (Year: 2017).*

(Continued)

*Primary Examiner* — Jessica Whiteley
(74) *Attorney, Agent, or Firm* — Element IP, PLC

(57) ABSTRACT

A radiation-sensitive resin composition contains: a polymer having a first structural unit represented by formula (1), and a second structural unit represented by formula (2) and having an acid-labile group. A first acid, to be generated from the first acid generating agent, disassociates the acid labile group in the polymer upon heating under a condition involving a temperature of no less than 80° C. and no greater than 140° C. for a time period of 1 minute, and the second acid, to be generated from the second acid generating agent, does not substantially disassociate the acid-labile group under the condition. The polymer is synthesized by RAFT, ATRP, or NMP, and a RAFT agent is at least one selected from the group consisting of a mercaptocarboxylic acid ester, a disulfide, a dithioester, a xanthate, a dithiocarbamate, and a trithiocarbonate.

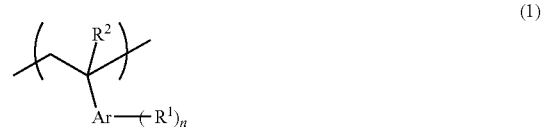

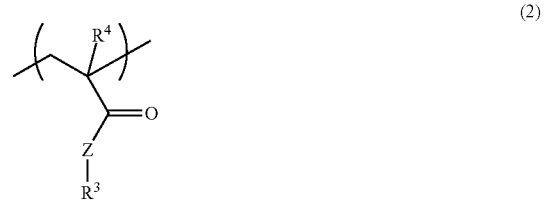

14 Claims, No Drawings

(56) References Cited

OTHER PUBLICATIONS

International Search Report dated May 28, 2019 in PCT/JP2019/007675 (with English translation), 5 pages.
Written Opinion dated May 28, 2019 in PCT/IP2019/007675 (with English translation), 9 pages.

\* cited by examiner

RADIATION-SENSITIVE RESIN COMPOSITION, PRODUCTION METHOD THEREOF, AND RESIST PATTERN-FORMING METHOD

CROSS-REFERENCE TO RELATED APPLICATIONS

The present application is a continuation application of International Application No. PCT/JP2019/007675, filed Feb. 27, 2019, which claims priority to Japanese Patent Application No. 2018-041960, filed Mar. 8, 2018. The contents of these applications are incorporated herein by reference in their entirety.

BACKGROUND OF THE INVENTION

Field of the Invention

The present invention relates to a radiation-sensitive resin composition, a production method thereof, and a resist pattern-forming method.

Description of the Related Art

Microfabrication of various types of electronic device structures such as semiconductor devices and liquid crystal devices has been accompanied by a requirement for further microfabrication of resist patterns in lithography processes, and a variety of radiation-sensitive resin compositions have been investigated for this purpose. Such a radiation-sensitive resin composition generates an acid in a light-exposed region upon irradiation with exposure light, e.g., a far ultraviolet ray such as an ArF excimer laser, an extreme ultraviolet ray (EUV), or an electron beam, to cause by a catalytic action of the acid a difference in a rate of dissolution in a developer solution between the light-exposed region and a light-unexposed region, thereby allowing a resist pattern to be formed on a substrate.

There are requirements for such a radiation-sensitive resin composition not only to be superior in resolution, but also to be superior in an inhibitory ability of defects, in which few defects are generated on a resist pattern, as well as in LWR (line width roughness) performance, in which the LWR is low in a case of a line-and-space pattern being formed; and for such a radiation-sensitive resin composition to enable forming a highly precise pattern. To meet these requirements, polymers which may be contained in a radiation-sensitive resin composition, as well as molecular structures and/or polymerization procedures thereof, have been extensively investigated (see Japanese Unexamined Patent Applications, Publication Nos. 2009-098687, 2009-102659, and 2016-186079).

PRIOR ART DOCUMENTS

Patent Documents

Patent Document 1: Japanese Unexamined Patent Application, Publication No. 2009-098687
Patent Document 2: Japanese Unexamined Patent Application, Publication No. 2009-102659
Patent Document 3: Japanese Unexamined Patent Application, Publication No. 2016-186079

SUMMARY OF THE INVENTION

However, under current circumstances, in which miniaturization of resist patterns has proceeded to a level in which line widths are 40 nm or less, required levels for the aforementioned types of performance are further elevated, and the conventional radiation-sensitive resin composition described above is not capable of meeting these requirements. Moreover, as EUV and the like have recently come to be used as exposure light, a radiation-sensitive resin composition is required to have improved sensitivity to EUV and the like as well.

The present invention was made in view of the foregoing circumstances, and an object of the present invention is to provide a radiation-sensitive resin composition, a resist pattern-forming method, and a production method of a radiation-sensitive resin composition being superior in the LWR performance and the inhibitory ability of defects, and having improved sensitivity.

An aspect of the invention made for solving the aforementioned problems is a radiation-sensitive resin composition (hereinafter, may be also referred to as "radiation-sensitive resin composition (I)") containing:

a polymer (hereinafter, may be also referred to as "(A) polymer" or "polymer (A)") having a first structural unit (hereinafter, may be also referred to as "structural unit (I)") represented by the following formula (1), and a second structural unit (hereinafter, may be also referred to as "structural unit (II)") represented by the following formula (2) and including an acid-labile group (hereinafter, may be also referred to as "acid-labile group (a)");

a first acid generating agent (hereinafter, may be also referred to as "(B) acid generating agent" or "acid generating agent (B)") which generates a first acid by irradiation with a radioactive ray; and a second acid generating agent (hereinafter, may be also referred to as "(C) acid generating agent" or "acid generating agent (C)") which generates a second acid by irradiation with a radioactive ray, wherein the first acid, to be generated from the acid generating agent (B), disassociates the acid-labile group (a) in the polymer (A) upon heating under a condition involving a temperature of no less than 80° C. and no greater than 140° C. for a time period of 1 minute, the second acid, to be generated from the acid generating agent (C), does not substantially disassociate the acid-labile group (a) under the condition, and a ratio (Mw/Mn) of a polystyrene-equivalent weight average molecular weight of the polymer (A) to a polystyrene-equivalent number average molecular weight of the polymer (A) as determined by gel permeation chromatography is less than 1.5,

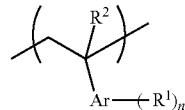

(1)

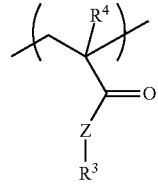

(2)

wherein, in the formula (1), Ar represents a group obtained by removing (n+1) hydrogen atoms from an arene having 6 to 20 carbon atoms; $R^1$ represents a hydroxy group, a sulfanyl group, or a monovalent organic group having 1 to 20 carbon atoms; n is an integer of 0 to 11, wherein in a case in which n is no less than 2, a plurality of R's are identical or different; and $R^2$ represents a hydrogen atom, a fluorine atom, a methyl group, or a trifluoromethyl group, and in the formula (2), $R^3$ represents a monovalent group having 1 to 20 carbon atoms and including the acid-labile group (a); Z represents a single bond, an oxygen atom, or a sulfur atom; and $R^4$ represents a hydrogen atom, a fluorine atom, a methyl group, or a trifluoromethyl group.

Another aspect of the invention made for solving the aforementioned problems is a radiation-sensitive resin composition (hereinafter, may be also referred to as "radiation-sensitive resin composition (II)") containing:

a polymer (hereinafter, may be also referred to as "(A') polymer" or "polymer (A')") having a first structural unit (structural unit (I)) represented by the following formula (1), and a second structural unit (structural unit (II)) represented by the following formula (2) and including an acid-labile group (acid-labile group (a));

the acid generating agent (B); and the acid generating agent (C), wherein the polymer (A') is a living polymerization product,

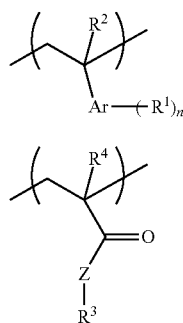

wherein, in the formula (1), Ar represents a group obtained by removing (n+1) hydrogen atoms from an arene having 6 to 20 carbon atoms; $R^1$ represents a hydroxy group, a sulfanyl group, or a monovalent organic group having 1 to 20 carbon atoms; n is an integer of 0 to 11, wherein in a case in which n is no less than 2, a plurality of $R^1$s are identical or different; and $R^2$ represents a hydrogen atom, a fluorine atom, a methyl group, or a trifluoromethyl group, and in the formula (2), $R^3$ represents a monovalent group having 1 to 20 carbon atoms and including the acid-labile group (a); Z represents a single bond, an oxygen atom, or a sulfur atom; and $R^4$ represents a hydrogen atom, a fluorine atom, a methyl group, or a trifluoromethylgroup.

It is to be noted that the radiation-sensitive resin composition (I) and the radiation-sensitive resin composition (II) may be generally referred to as "the radiation-sensitive resin composition of the aspects of the present invention."

A still other aspect of the invention made for solving the aforementioned problems is a resist pattern-forming method including: applying the radiation-sensitive resin composition (I) or the radiation-sensitive resin composition (II) directly or indirectly on a substrate; exposing a resist film formed by the applying; and developing the resist film exposed.

A still yet other aspect of the present invention made for solving the aforementioned problems is a production method of a radiation-sensitive resin composition including:

conducting living polymerization in a monomer composition containing a first monomer (hereinafter, may be also referred to as "monomer (i)") represented by the following formula (i), and a second monomer (hereinafter, may be also referred to as "monomer (ii)") represented by the following formula (ii) and including an acid-labile group (acid-labile group (a)); and obtaining a mixture containing:

a polymer (polymer (A)) having a ratio (Mw/Mn) of a polystyrene-equivalent weight average molecular weight thereof to a number average molecular weight thereof as determined by gel permeation chromatography being less than 1.5;

a first acid generating agent (acid generating agent (B)) which generates a first acid by irradiation with a radioactive ray; and a second acid generating agent (acid generating agent (C)) which generates a second acid by irradiation with a radioactive ray, wherein the first acid, to be generated from the first acid generating agent, disassociates the acid-labile group (a) in the polymer upon heating under a condition involving a temperature of no less than 80° C. and no greater than 140° C. for a time period of 1 minute, and the second acid, to be generated from the second acid generating agent, does not substantially disassociate the acid-labile group (a) under the condition,

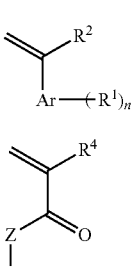

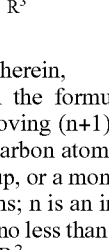

wherein, in the formula (i), Ar represents a group obtained by removing (n+1) hydrogen atoms from an arene having 6 to 20 carbon atoms; $R^1$ represents a hydroxy group, a sulfanyl group, or a monovalent organic group having 1 to 20 carbon atoms; n is an integer of 0 to 11, wherein in a case in which n is no less than 2, a plurality of $R^1$s are identical or different; and $R^2$ represents a hydrogen atom, a fluorine atom, a methyl group, or a trifluoromethyl group, and in the formula (ii), $R^3$ represents a monovalent group having 1 to 20 carbon atoms and including the acid-labile group (a); Z represents a single bond, an oxygen atom, or a sulfur atom; and $R^4$ represents a hydrogen atom, a fluorine atom, a methyl group, or a trifluoromethyl group.

The radiation-sensitive aspect composition and the resist pattern-forming method of the aspects of the present invention enable a resist pattern to be formed with improved sensitivity, few defects, and low LWR. The production method of a radiation-sensitive resin composition of the still yet other aspect of the present invention enables the radiation-sensitive resin composition of the aspects of the present invention to be produced in a convenient and certain manner. Therefore, these can be suitably used in manufacturing processes of semiconductor devices, in which further progress of miniaturization is expected in the future.

DESCRIPTION OF THE EMBODIMENTS

Radiation-Sensitive Resin Composition (I)

The radiation-sensitive resin composition (I) of one embodiment of the present invention contains the polymer (A), the acid generating agent (B), and the acid generating agent (C). The radiation-sensitive resin composition (I) may contain, as a favorable component, a solvent (D), and may contain, within a range not leading to impairment of the effects of the present invention, other optional component(s).

Due to containing the polymer (A), the acid generating agent (B), and the acid generating agent (C) and the Mw/Mn of the polymer (A) being less than 1.5, the radiation-sensitive resin composition (I) is superior in each of the inhibitory ability of defects, the LWR performance, and the sensitivity. Although not necessarily clarified and without wishing to be bound by any theory, the reason for achieving the aforementioned effects by the radiation-sensitive resin composition (I) due to involving such a constitution may be presumed, for example, as in the following. Due to containing: the polymer (A) being a copolymer of a (meth)acrylic acid ester including a styrene monomer and an acid-labile group; the acid generating agent (B), which generates the first acid and disassociates the acid-labile group of the polymer (A); and the acid generating agent (C) as an acid diffusion control agent, and to the Mw/Mn of the polymer (A) being less than a certain specified amount, variance of polymer constitution and variance of molecular weight are decreased, and accordingly, variance of solubility of a resist film to be formed decreases. It is considered that as a result, generation of defects on a resist pattern is decreased, and the LWR of the resist pattern is lowered. Furthermore, is it considered that due to variance of the solubility being decreased, an optimal exposure dose is further decreased, and thus sensitivity improves.

Hereinafter, each component will be described.

(A) Polymer

The polymer (A) has the structural unit (I) and the structural unit (II), and a ratio (Mw/Mn) of the polystyrene-equivalent weight average molecular weight of the polymer to the polystyrene-equivalent number average molecular weight of the polymer as determined by gel permeation chromatography is less than 1.5. The radiation-sensitive resin composition (I) may contain one, or two or more types of the polymer (A).

The Mw/Mn of the polymer (A) is a value being less than 1.5, and is more preferably a value being less than 1.35. The Mw/Mn is typically no less than 1, and is preferably no less than 1.1, and more preferably no less than 1.2. When the Mw/Mn of the polymer (A) falls within the above range, variance of polymer (A) constitution is further decreased, and as a result, the inhibitory ability of defects, the LWR performance, and the sensitivity can be further improved.

The lower limit of the Mw of the polymer (A) is preferably 1,000, more preferably 3,000, still more preferably 4,000, particularly preferably 5,000, further particularly preferably 6,000, and most preferably 6,500. The upper limit of the Mw is preferably 50,000, more preferably 30,000, still more preferably 20,000, particularly preferably 10,000, further particularly preferably 8,000, and most preferably 7,000.

The lower limit of the Mn of the polymer (A) is preferably 800, more preferably 2,500, still more preferably 3,000, particularly preferably 4,000, further particularly preferably 4,600, and most preferably 5,200. The upper limit of the Mn is preferably 40,000, more preferably 23,000, still more preferably 15,000, particularly preferably 8,000, further particularly preferably 6,000, and most preferably 5,200.

When the Mw or the Mn of the polymer (A) falls within the above range, with regard to the radiation-sensitive resin composition (I), it is possible to make further prominent a difference in solubility between a light-exposed region and a light-unexposed region, and to further suppress variance in solubility. As a result, the inhibitory ability of defects, the LWR performance, and the sensitivity can be further improved.

The Mw and Mn of the polymer herein are values determined using gel permeation chromatography (GPC) under the following conditions.

GPC columns: "G2000 HXL"×2, "G3000 HXL"×1, and "G4000 HXL"×1, available from Tosoh Corporation
  column temperature: 40° C.
  elution solvent: tetrahydrofuran (Wako Pure Chemical Industries, Ltd.)
  flow rate: 1.0 mL/min
  sample concentration: 1.0% by mass
  amount of injected sample: 100 uL
  detector: differential refractometer
  standard substance: mono-dispersed polystyrene Other than the structural units (I) and (II), the polymer (A) may contain: a structural unit (hereinafter, may be also referred to as "structural unit (III)") containing a lactone structure, a cyclic carbonate structure, a sultone structure, or a combination thereof; and/or a structural unit (hereinafter, may be also referred to as "structural unit (IV)") containing an alcoholic hydroxyl group, and may also contain other structural unit(s) aside from the structural units (I) to (IV). The polymer (A) may contain one, or two or more types of each structural unit. Each structural unit will be described below.

Structural Unit (I)

The structural unit (I) is represented by the following formula (1).

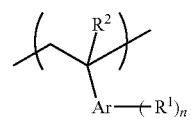

(1)

In the above formula (1), Ar represents a group obtained by removing (n+1) hydrogen atoms from an arene having 6 to 20 carbon atoms; $R^1$ represents a hydroxy group, a sulfanyl group, or a monovalent organic group having 1 to 20 carbon atoms; n is an integer of 0 to 11, wherein in a case in which n is no less than 2, a plurality of $R^1$s are identical or different; and $R^2$ represents a hydrogen atom, a fluorine atom, a methyl group, or a trifluoromethyl group.

Examples of the arene having 6 to 20 carbon atoms that gives Ar in the above formula (1) include benzene, naphthalene, anthracene, phenanthrene, tetracene, pyrene, and the like. Of these, benzene is preferred.

The monovalent organic group having 1 to 20 carbon atoms which may be represented by $R^1$ is exemplified by: a monovalent hydrocarbon group having 1 to 20 carbon atoms; a monovalent group (g) that includes a divalent hetero atom-containing group between two adjacent carbon atoms of the monovalent hydrocarbon group having 1 to 20 carbon atoms, or at an end of the atomic bonding side of the monovalent hydrocarbon group having 1 to 20 carbon atoms; a monovalent group obtained by substituting with a monovalent hetero atom-containing group a part or all of hydrogen atoms included in the monovalent hydrocarbon group having 1 to 20 carbon atoms or the monovalent group (g); and the like.

The monovalent hydrocarbon group having 1 to 20 carbon atoms is exemplified by a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, and the like.

The "hydrocarbon group" herein may include a chain hydrocarbon group, an alicyclic hydrocarbon group, or an aromatic hydrocarbon group. The "hydrocarbon group" may be either a saturated hydrocarbon group or an unsaturated hydrocarbon group. The "chain hydrocarbon group" as referred to herein means a hydrocarbon group not including a cyclic structure but being constituted with only a chain structure, and may be exemplified by a linear hydrocarbon group and a branched hydrocarbon group. The "alicyclic hydrocarbon group" as referred to herein means a hydrocarbon group that includes, as a ring structure, not an aromatic ring structure but an alicyclic structure alone, and may be exemplified by a monocyclic alicyclic hydrocarbon group and a polycyclic alicyclic hydrocarbon group. In this regard, it is not necessary for the alicyclic hydrocarbon group to be constituted with only an alicyclic structure; it may include a chain structure in a part thereof. The "aromatic hydrocarbon group" as referred to herein means a hydrocarbon group that includes an aromatic ring structure as a ring structure. In this regard, it is not necessary for the aromatic hydrocarbon group to be constituted with only an aromatic ring structure; it may include a chain structure and/or an alicyclic structure in a part thereof.

Examples of the monovalent chain hydrocarbon group having 1 to 20 carbon atoms include:

alkyl groups such as a methyl group, an ethyl group, an n-propyl group, an i-propyl group, and a t-butyl group;

alkenyl groups such as an ethenyl group, a propenyl group, and a butenyl group; alkynyl groups such as an ethynyl group, a propynyl group, and a butynyl group; and the like.

Examples of the monovalent alicyclic hydrocarbon group having 3 to 20 carbon atoms include:

monocyclic alicyclic saturated hydrocarbon groups such as a cyclopentyl group and a cyclohexyl group;

monocyclic alicyclic unsaturated hydrocarbon groups such as a cyclopentenyl group and a cyclohexenyl group;

polycyclic alicyclic saturated hydrocarbon groups such as a norbornyl group, an adamantyl group, and a tricyclodecyl group;

polycyclic alicyclic unsaturated hydrocarbon groups such as a norbornenyl group and a tricyclodecenyl group; and the like.

Examples of the monovalent aromatic hydrocarbon group having 6 to 20 carbon atoms include:

aryl groups such as a phenyl group, a tolyl group, a xylyl group, a naphthyl group, and an anthryl group;

aralkyl groups such as a benzyl group, a phenethyl group, a naphthylmethyl group, and an anthrylmethyl group; and the like.

The hetero atom constituting the monovalent hetero atom-containing group or the divalent atom-containing group is exemplified by an oxygen atom, a nitrogen atom, a sulfur atom, a phosphorus atom, a silicon atom, a halogen atom, and the like. Examples of the halogen atom include a fluorine atom, a chlorine atom, a bromine atom, an iodine atom, and the like.

Examples of the divalent hetero atom-containing group include —O—, —CO—, —S—, —CS—, —NR'—, —SO—, —SO$_2$—, a combination of two or more of these, and the like, wherein R' represents a hydrogen atom or a monovalent hydrocarbon group.

Examples of the monovalent hetero atom-containing group include: halogen atoms such as a fluorine atom, a chlorine atom, a bromine atom, and an iodine atom; a hydroxy group; a carboxy group; a cyano group; an amino group; a sulfanyl group; and the like.

$R^1$ represents preferably a hydroxy group or a sulfanyl group, and more preferably a hydroxy group.

It is preferred that at least one $R^1$ in the above formula (1) represents a hydroxy group. The polymer (A) having such a phenolic hydroxyl group enables sensitivity in the case of using a KrF excimer laser beam, an EUV, an electron beam, or the like to be further improved, and the LWR performance and the inhibitory ability of defects to be further improved.

Examples of the structural unit (I) include structural units represented by the following formulae, and the like.

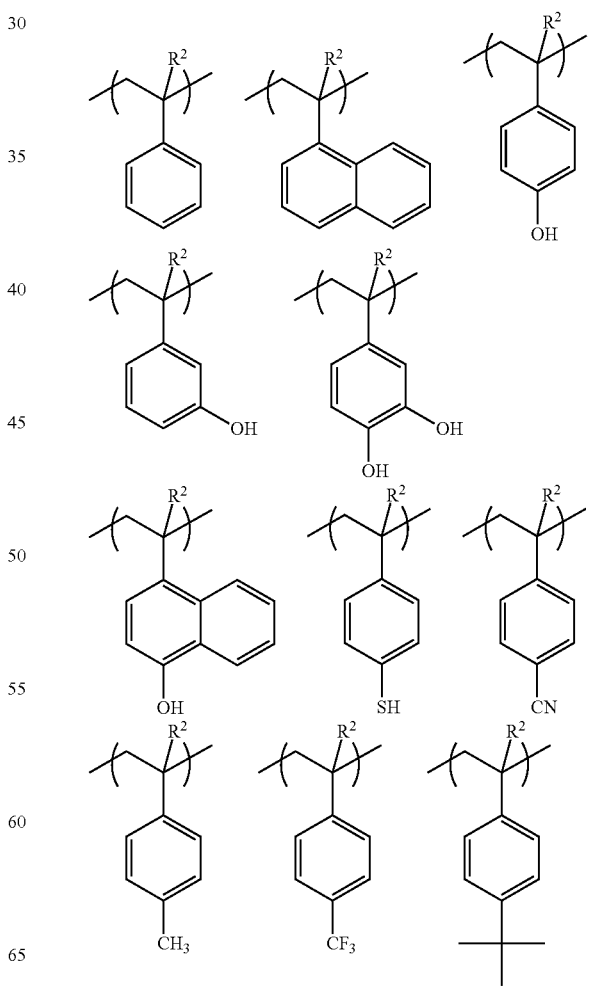

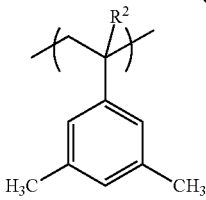

In the above formulae, $R^2$ is as defined in the above formula (1).

The structural unit (I) is preferably a structural unit including a phenolic hydroxyl group, and more preferably a structural unit derived from 4-hydroxystyrene, a structural unit derived from 3-hydroxystyrene, or a structural unit derived from 3,4-dihydroxystyrene. The "phenolic hydroxyl group" as referred to herein is not limited to a hydroxy group directly bonding to a benzene ring, and means any hydroxy group directly bonding to an aromatic ring in general.

The lower limit of a proportion of the structural unit (I) contained with respect to total structural units constituting the polymer (A) is preferably 5 mol %, more preferably 10 mol %, still more preferably 15 mol %, and particularly preferably 20 mol %. The upper limit of the proportion is preferably 80 mol %, more preferably 70 mol %, still more preferably 60 mol %, and particularly preferably 55 mol %. When the proportion of the structural unit (I) falls within the above range, the inhibitory ability of defects, the LWR performance, and the sensitivity can be further improved.

Structural Unit (II)

The structural unit (II) is represented by the following formula (2) and includes the acid-labile group (a). The "acid-labile group" as referred to herein means a group that substitutes for a hydrogen atom of an acidic group such as a carboxy group, a phenolic hydroxyl group, or a sulfonic group, and is dissociable by an action of an acid. Due to having the structural unit (II), in the polymer (A), the acid-labile group (a) in a light-exposed region is disassociated by an action of the first acid generated by the acid generating agent (B) or the like, causing the polarity to increase and thereby enabling formation of a resist pattern due to the polymer (A) becoming more easily soluble or more slightly soluble in a developer solution.

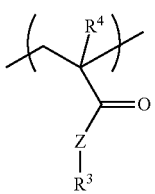

(2)

In the above formula (2), $R^3$ represents a monovalent group having 1 to 20 carbon atoms and including the acid-labile group (a); Z represents a single bond, an oxygen atom, or a sulfur atom; and $R^4$ represents a hydrogen atom, a fluorine atom, a methyl group, or a trifluoromethyl group.

Examples of the monovalent group having 1 to 20 carbon atoms and including the acid-labile group (a) represented by $R^3$ include groups represented by the following formula (3), and the like.

$$—R^5—X—R^6 \quad (3)$$

In the above formula (3), $R^5$ represents a single bond or a divalent organic group having 1 to 20 carbon atoms; X represents —COO—, —SO$_3$—, —Ar'—O—, or a single bond, wherein Ar' represents a substituted or unsubstituted arenediyl group having 6 to 20 carbon atoms; and $R^6$ represents a monovalent acid-labile group.

The divalent organic group which may be represented by $R^5$ is exemplified by groups obtained by removing one hydrogen atom from the groups exemplified as the monovalent organic group which may be represented by $R^1$ in the above formula (1), and the like.

$R^5$ represents preferably a single bond or a divalent hydrocarbon group having 1 to 10 carbon atoms, and more preferably a single bond.

X represents preferably —COO— or a single bond, and more preferably a single bond.

The monovalent acid-labile group represented by $R^6$ is exemplified by a group represented by the following formula (PG1), a group represented by the following formula (PG2), and the like.

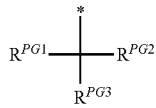

(PG1)

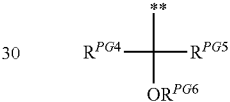

(PG2)

In the above formula (PG1), $R^{PG1}$ represents a monovalent hydrocarbon group having 1 to 20 carbon atoms; $R^{PG2}$ and $R^{PG3}$ each independently represent a monovalent hydrocarbon group having 1 to 20 carbon atoms, or $R^{PG2}$ and $R^{PG3}$ taken together represent an alicyclic structure having 3 to 20 ring atoms, constituted together with the carbon atom to which $R^{PG2}$ and $R^{PG3}$ bond; and * represents a site to which an oxy-oxygen atom derived from an acidic group bonds, wherein, in a case of being polycyclic, "ring atoms" means a sum of the number of atoms constituting the rings.

In the above formula (PG2), $R^{PG4}$ and $R^{PG5}$ each independently represent an oxygen atom or a monovalent hydrocarbon group having 1 to 20 carbon atoms, or $R^{PG4}$ and $R^{PG5}$ taken together represent an alicyclic structure having 3 to 20 ring atoms constituted together with the carbon atom to which $R^{PG4}$ and $R^{PG5}$ bond; $R^{PG6}$ represents a monovalent hydrocarbon group having 1 to 20 carbon atoms; and ** represents a site to which an oxy-oxygen atom derived from an acidic group bonds.

Examples of the monovalent hydrocarbon group having 1 to 20 carbon atoms which may be represented by $R^{PG1}$ to $R^{PG6}$ include groups similar to those exemplified as the hydrocarbon group which may be represented by $R^1$ in the above formula (1).

Examples of the alicyclic structure having 3 to 20 ring atoms which may be constituted by $R^{PG2}$ and $R^{PG3}$, or $R^{PG4}$ and $R^{PG5}$ include a cyclopentane structure, a cyclohexane structure, a cycloheptane structure, a cyclooctane structure, a norbornane structure, an adamantane structure, a tricyclodecane structure, a tetracyclododecane structure, and the like.

Examples of an alicyclic heterocyclic structure having 5 to 20 ring atoms which may be constituted by $R^{PG4}$ and $R^{PG6}$, or $R^{PG5}$ and $R^{PG6}$ include an oxacyclopentane structure, an oxacyclohexane structure, an oxacycloheptane structure, an oxacyclooctane structure, an oxanorbornane structure, and the like.

Examples of the structural unit (II) include a structural unit derived from a (meth)acrylic acid ester having a monovalent acid-labile group, and the like.

The lower limit of a proportion of the structural unit (II) contained with respect to total structural units constituting the polymer (A) is preferably 10 mol %, more preferably 20 mol %, and still more preferably 30 mol %. The upper limit of the proportion is preferably 80 mol %, more preferably 70 mol %, and still more preferably 60 mol %. When the proportion of the structural unit (II) falls within the above range, the inhibitory ability of defects, the LWR performance, and the sensitivity can be further improved.

Structural Unit (III)

The structural unit (III) is a structural unit containing a lactone structure, a cyclic carbonate structure, a sultone structure, or a combination thereof. When the polymer (A) has the structural unit (III), solubility in a developer solution can be appropriately adjusted, and as a result, the inhibitory ability of defects, the LWR performance, and the sensitivity can be further improved. Furthermore, adhesiveness of the resist pattern to the substrate can be further improved.

Examples of the structural unit (III) include structural units represented by the following formulae, and the like.

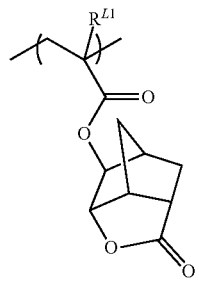 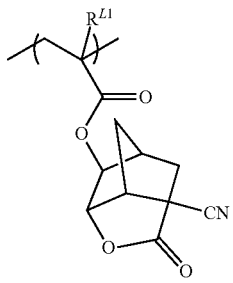

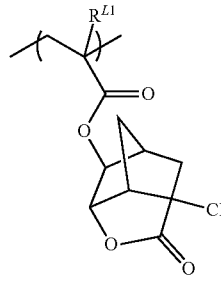 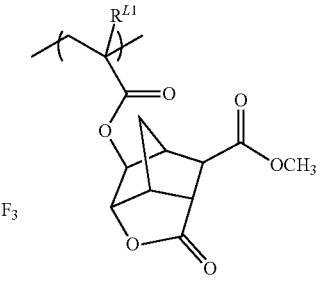

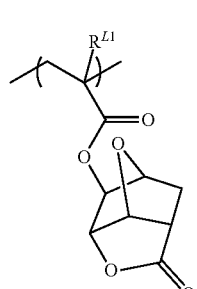 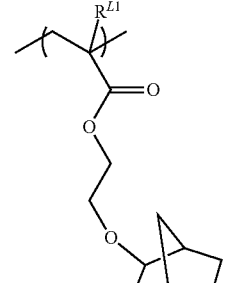

 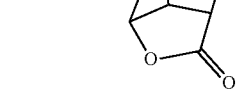

-continued

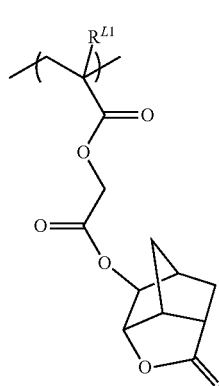 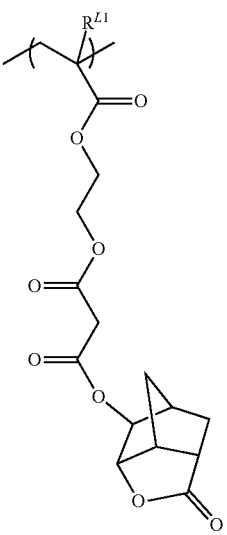

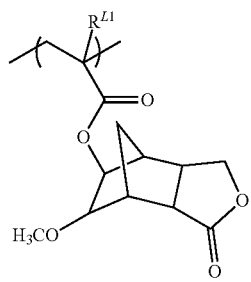 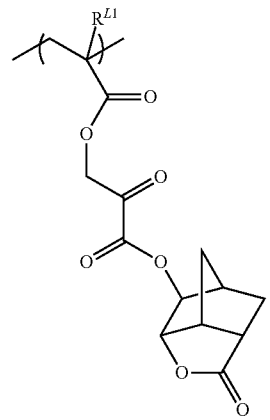

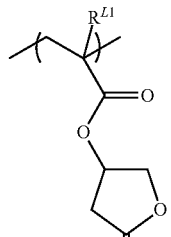 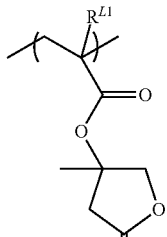 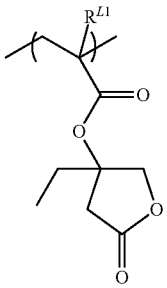

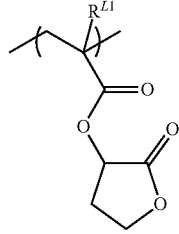 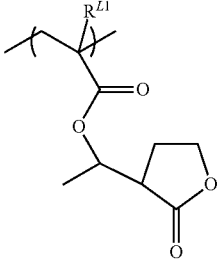

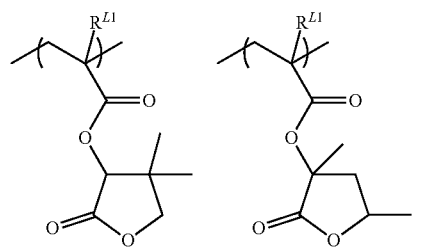
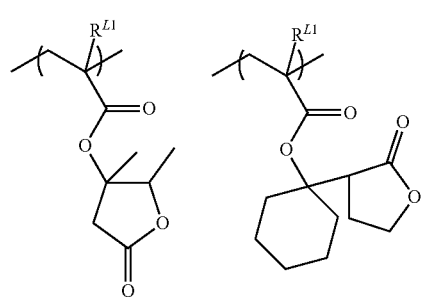
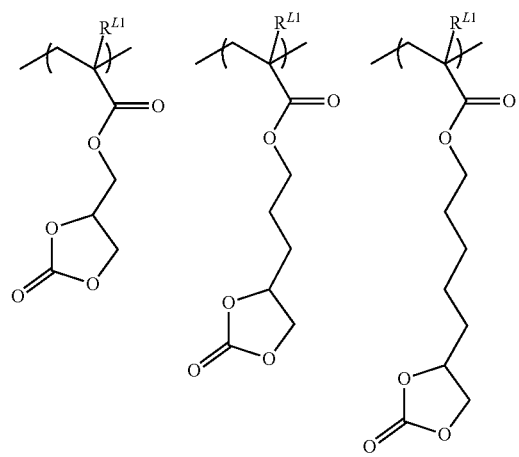
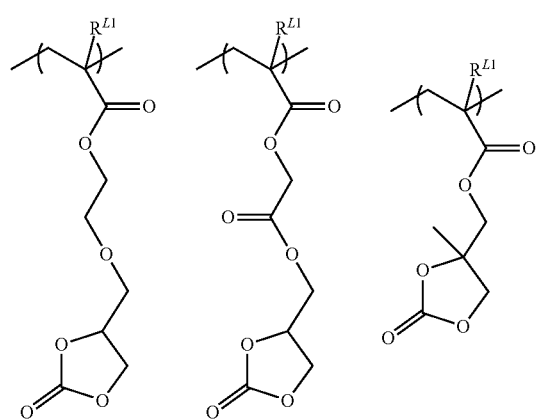
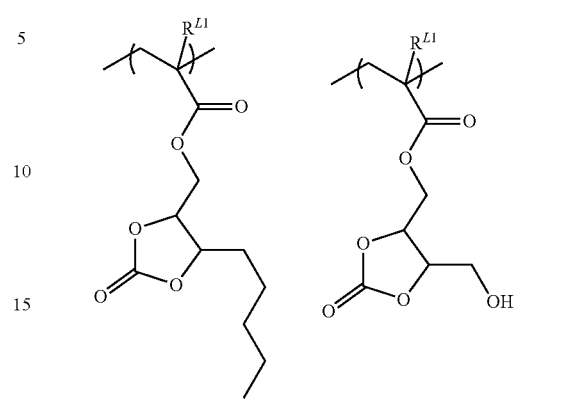
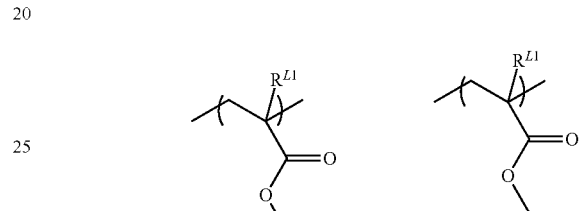
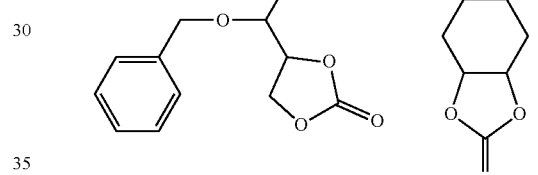
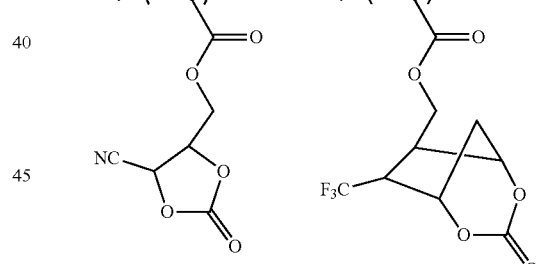
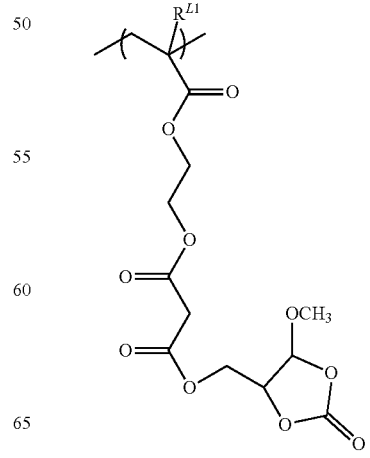

-continued

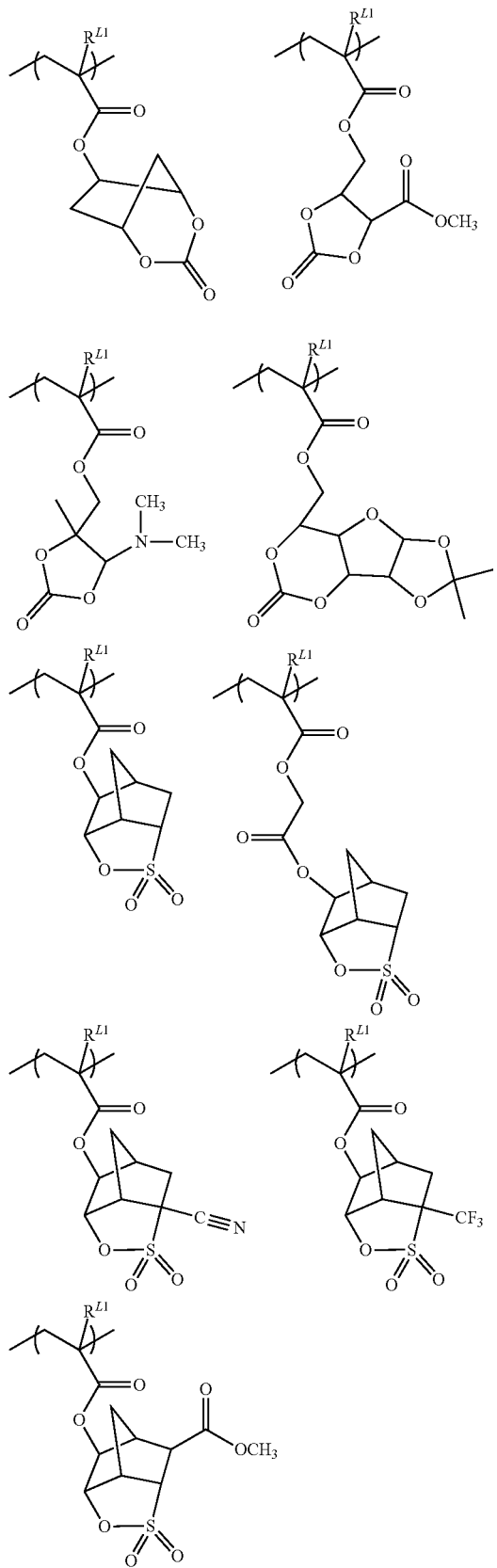
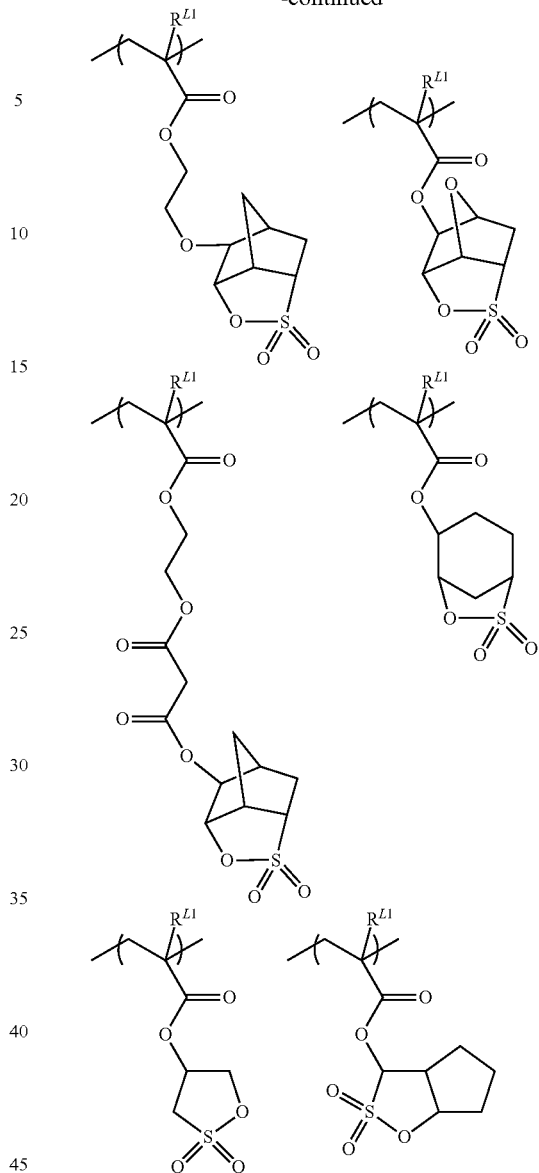

In each of the above formulae, $R^{L1}$ represents a hydrogen atom, a fluorine atom, a methyl group, or a trifluoromethyl group.

The structural unit (III) is preferably a structural unit containing a lactone structure, and more preferably a structural unit derived from a 5-cyanonorbornanelactone-yl (meth)acrylic acid ester.

In a case in which the polymer (A) has the structural unit (III), the lower limit of a proportion of the structural unit (III) contained with respect to total structural units in the polymer (A) is preferably 10 mol %, more preferably 20 mol %, and still more preferably 25 mol %. The upper limit of the proportion is preferably 80 mol %, more preferably 50 mol %, and still more preferably 40 mol %. By having the proportion of the structural unit (III) fall within the above range, solubility of the polymer (A) in a developer solution can be appropriately adjusted, and as a result, the inhibitory ability of defects, the LWR performance, and the sensitivity can be further improved. Furthermore, adhesiveness of the resist pattern to the substrate can be further improved.

Structural Unit (IV)

The structural unit (IV) contains an alcoholic hydroxyl group. Due to having the structural unit (IV), solubility of the polymer (A) in a developer solution can be appropriately adjusted, and as a result, the inhibitory ability of defects, the LWR performance, and the sensitivity can be further improved.

Examples of the structural unit (IV) include structural units represented by the following formulae, and the like.

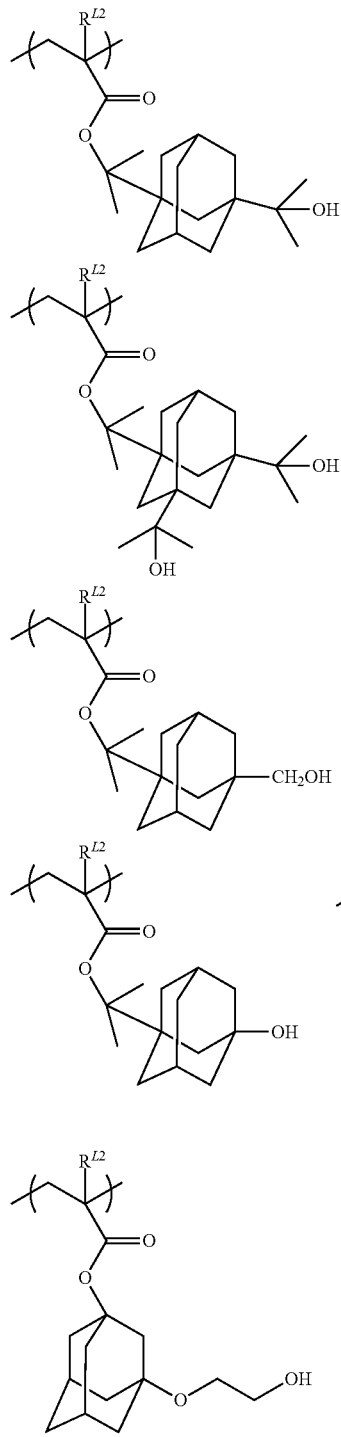

-continued

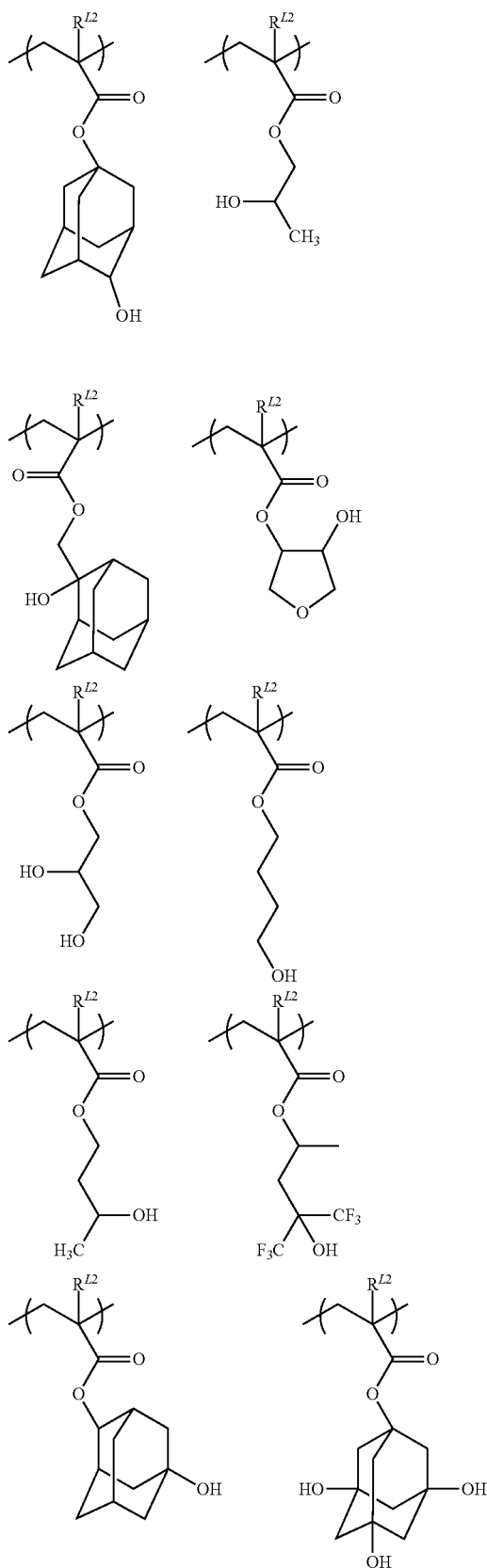

-continued

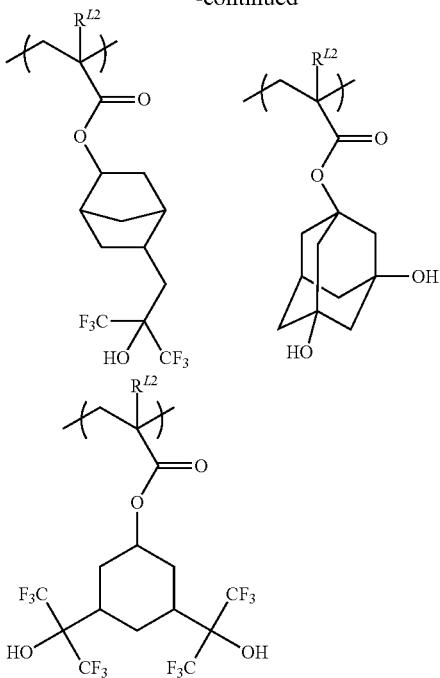

In each of the above formulae, $R^{L2}$ represents a hydrogen atom, a fluorine atom, a methyl group, or a trifluoromethyl group.

In a case in which the polymer (A) has the structural unit (IV), the lower limit of a proportion of the structural unit (IV) contained with respect to total structural units in the polymer (A) is preferably 1 mol %, more preferably 5 mol %, and still more preferably 10 mol %. The upper limit of the proportion is preferably 50 mol %, more preferably 40 mol %, and still more preferably 30 mol %. By having the proportion of the structural unit (IV) fall within the above range, solubility of the polymer (A) in the developer solution can be appropriately adjusted, and as a result, the inhibitory ability of defects, the LWR performance, and the sensitivity can be further improved.

Other Structural Unit(s)

The other structural unit(s) may be exemplified by a structural unit containing a polar group, a structural unit containing an acid-nonlabile hydrocarbon group, and the like (excluding structural units belonging to structural units (I) to (IV)). Examples of the polar group include a hydroxy group, a carboxy group, a nitro group, a cyano group, a sulfonamide group, and the like. Examples of the acid-nonlabile hydrocarbon group include a chain hydrocarbon group in which the carbon atom serving as an atomic bond which bonds to the oxy-oxygen atom of —COO— is a primary or secondary carbon atom, an aliphatic hydrocarbon group in which the carbon atom serving as an atomic bond is a primary or secondary carbon atom, a methyl group, a 1-adamantyl group, or the like. Of these, the acid-nonlabile hydrocarbon group is preferably the aliphatic hydrocarbon group in which the carbon atom serving as an atomic bond is a secondary carbon atom, or a 1-adamantyl group. In the case in which the polymer (A) has the other structural unit(s), the upper limit of a proportion of the other structural unit(s) is preferably 30 mol %, and more preferably 10 mol %. The lower limit of the proportion is, for example, 1 mol %.

The lower limit of a content of the polymer (A) with respect to all components of the radiation-sensitive resin composition (I) other than the solvent (D) is preferably 50 parts by mass, more preferably 60 parts by mass, and still more preferably 70 parts by mass. The radiation-sensitive resin composition (I) may contain one, or two or more types of the polymer (A).

The polymer (A) is preferably a living polymerization product, and more preferably a living radical polymerization product.

Synthesis Procedure of Polymer (A)

The polymer (A) can be synthesized by using a polymerization initiator and the like to polymerize, in an appropriate solvent, a monomer composition containing the monomer (i) which gives the structural unit (I), the monomer (ii) which gives the structural unit (II), and as necessary another monomer aside from these monomers.

In light of enabling convenient and certain synthesis of a polymer having a small Mw/Mn, the polymerization procedure for synthesizing the polymer (A) is preferably living polymerization such as living cationic polymerization, living anionic polymerization, living radical polymerization, or the like. Of these, in light of superior polymerization controllability, living radical polymerization is preferred.

Examples of living radical polymerization include reversible addition-fragmentation chain-transfer (RAFT) polymerization, atom transfer radical polymerization (ATRP), nitroxide-mediated radical polymerization (NMP), and the like.

The RAFT polymerization is carried out by using a reversible addition-fragmentation chain-transfer agent (RAFT agent) together with a radical polymerization initiator.

Examples of a radical polymerization initiator used in the RAFT polymerization include:

azo-based radical initiators such as azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile), and dimethyl 2,2'-azobisisobutyrate;

peroxide-based radical initiators such as benzoyl peroxide, t-butyl hydroperoxide, and cumene hydroperoxide; and the like. These radical polymerization initiators may be used alone of one type, or as a mixture of two or more types thereof.

Examples of the RAFT agent include:

mercaptocarboxylic acids such as mercaptopropionic acid;

mercaptocarboxylic acid esters such as 2-ethylhexyl 3-mercaptopropionate;

thiols such as 4-mercapto-1-butanol;

disulfides such as 2-hydroxyethyl disulfide;

dithioesters such as cumyl dithiobenzoate:

xanthates such as ethyl ethylxanthogenate;

dithiocarbamates such as benzyldiethyl dithiocarbamate;

trithiocarbonates such as 2-cyano-2-propyldodecyl trithiocarbonate, 4-cyano-4-[(dodecylsulfanylthiocarbonyl)sulfanyl]pentanate, and cyanomethyldodecyl trithiocarbonate; and the like.

The ATRP is carried out using as a radical polymerization initiator an atom transfer radical polymerization initiator, in the presence of a reducing agent and a transition metal catalyst.

Examples of the atom transfer radical polymerization initiator include propyl-2-bromopropionate, methyl-2-chloropropionate, ethyl-2-chloropropionate, methyl-2-bromopropionate, ethyl-2-bromoisobutyrate, methyl-2-bromoisobutyrate, ethylene bis(2-bromoisobutyrate), 1,1,1-tris (2-bromoisobutyloxymethyl)ethane, and the like.

Examples of the reducing agent for use in the ATRP include ascorbic acid, an ascorbic acid ester, an organic tin (II) compound, sodium sulfite, a sulfur compound in a low-oxidation state, sodium bisulfite, hydrazine hydrate, acetylacetonate, hydroxyacetone, reducing sugar, simple sugar, tetrahydrofuran, dihydroanthracene, silane, 2,3-dimethylbutadiene, an amine, formamidinesulfinic acid, a borane compound, an aldehyde, an inorganic or organic compound selected from a group consisting of an inorganic salt including a metal selected from $Fe^{2+}$, $Cr^{3+}$, $Al^{3+}$, $Ti^{3+}$, and $Ti^{4+}$, and the like.

The transition metal catalyst for use in the ATRP is exemplified by a compound containing a transition metal ion and a ligand, and the like.

Examples of the transition metal include Cu, Fe, Co, Cr, Ni, Sm, Mn, Mo, Ag, Zn, Pd, Pt, Re, Rh, Ir, In, Yb, Ru, and the like.

Examples of the ligand include triphenylphosphane, 2,2-bipyridine, alkyl-2,2-bipyridine, 4,4-di-(5-nonyl)-2,2-bipyridine, 4,4-di-(5-heptyl)-2,2-bipyridine, tris(2-aminoethyl)amine (TREN), tris(2-pyridylmethyl)amine (TPMA), N,N,N',N',N''-pentamethyldiethylenetriamine, 1,1,4,7,10,10-hexamethyltriethylenetetramine, tetramethylethylenediamine, and the like.

The NMP is carried out using an NMP initiator as the radical polymerization initiator.

Examples of the NMP initiator include 2,2,6,6-tetramethylpiperidinoxyl (TEMPO), 2,2,6,6,-tetramethylpiperidinoxyl-4-ol (TEMPOL), 2,2,6,6-tetramethylpiperidinoxyl-4-ketone (TEMPON), and the like.

Examples of the solvent for use in the living radical polymerization include:

alkanes such as n-pentane, n-hexane, n-heptane, n-octane, n-nonane, and n-decane;

cycloalkanes such as cyclohexane, cycloheptane, cyclooctane, decalin, and norbornane;

aromatic hydrocarbons such as benzene, toluene, xylene, ethyl benzene, and cumene;

halogenated hydrocarbons such as chlorobutane, bromohexane, dichloroethane, hexamethylene dibromide, and chlorobenzene;

saturated carboxylic acid esters such as ethyl acetate, n-butyl acetate, i-butyl acetate, and methyl propionate;

ketones such as acetone, methyl ethyl ketone, 4-methyl-2-pentanone, and 2-heptanone;

ethers such as tetrahydrofuran, dimethoxyethanes, and diethoxyethanes;

alcohols such as methanol, ethanol, 1-propanol, 2-propanol, and 4-methyl-2-pentanol; and the like. These solvents for use in polymerization may be used alone of one type, or in a combination of two or more types thereof.

The lower limit of a reaction temperature in the living radical polymerization is preferably 40° C., and more preferably 50° C. The upper limit of the reaction temperature is preferably 150° C., and more preferably 140° C. The lower limit of a time period for the reaction in the living polymerization is preferably 1 hr, and more preferably 3 hrs. The upper limit of the time period for the reaction is preferably 96 hrs, and more preferably 48 hrs.

In the structural unit (I) of the polymer (A), in the case in which at least one $R^1$ in the above formula (1) represents a hydroxy group, the polymer (A) may be synthesized by: conducting polymerization with, as the monomer (i), a monomer represented by the above formula (i), wherein $R^1$ represents an acyloxy group such as an acetoxy group; and generating a hydroxy group by allowing for a hydrolysis reaction of the acyloxy group of a resulting polymer in the presence of a base such as triethylamine.

(B) Acid Generating Agent

The acid generating agent (B) generates, by irradiation with a radioactive ray, a first acid (hereinafter, may be also referred to as "acid (b)") which disassociates the acid-labile group (a) upon heating under a condition involving a temperature of no less than 80° C. and no greater than 140° C. for a time period of 1 minute. By conducting heating, e.g., post-exposure baking (PEB) or the like, for 1 minute at a temperature in a range of 80° C. to 140° C., the acid-labile group (a) of the polymer (A) is disassociated due to an action of the acid (b) generated from the acid generating agent (B) in a light-exposed region by irradiation with a radioactive ray. As a result, the solubility of the polymer (A) in a developer solution changes in the light-exposed region, enabling formation of a resist pattern.

The lower limit of the temperature is preferably 80° C., more preferably 90° C., and still more preferably 100° C. The upper limit of the temperature is preferably 140° C., more preferably 135° C., and still more preferably 130° C.

The acid (b) is exemplified by a sulfonic acid, an imidic acid, an amide acid, a methide acid, a phosphinic acid, a carboxylic acid, and the like. Of these, a sulfonic acid is preferred.

Examples of the sulfonic acid include a compound (hereinafter, may be also referred to as "acid (b1)" represented by the following formula (4), and the like. It is considered that when the acid generating agent (B) generates the acid (b1) containing a ring structure, a diffusion length of the acid (b1) in the resist film is appropriately shortened, and as a result, the inhibitory ability of defects, the LWR performance, and the sensitivity can be further improved.

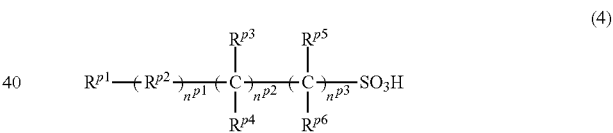

(4)

In the above formula (4), $R^{p1}$ represents a monovalent group containing a ring structure having 5 or more ring atoms; $R^{p2}$ represents a divalent linking group; $R^{p3}$ and $R^{p4}$ each independently represent a hydrogen atom, a fluorine atom, a monovalent hydrocarbon group having 1 to 20 carbon atoms, or a monovalent fluorinated hydrocarbon group having 1 to 20 carbon atoms; $R^{p5}$ and $R^{p6}$ each independently represent a fluorine atom or a monovalent fluorinated hydrocarbon group having 1 to 20 carbon atoms; $n^{p1}$ is an integer of 0 to 10; $n^{p2}$ is an integer of 0 to 10; and $n^{p3}$ is an integer of 0 to 10, wherein a sum of $n^{p1}$, $n^{p2}$, and $n^{p3}$ is no less than 1 and no greater than 30, in a case in which $n^{p1}$ is no less than 2, a plurality of $R^{p3}$ are identical or different, in a case in which $n^{p2}$ is no less than 2, a plurality of $R^{p3}$s are identical or different and a plurality of $R^{p4}$s are identical or different, and in a case in which $n^{p3}$ is no less than 2, a plurality of $R^{p5}$s are identical or different and a plurality of $R^{p6}$s are identical or different.

The monovalent group containing a ring structure having 5 or more ring atoms which is represented by $R^{p1}$ is exemplified by a monovalent group containing an alicyclic structure having 5 or more ring atoms, a monovalent group containing an aliphatic heterocyclic structure having 5 or more ring atoms, a monovalent group containing an aromatic ring structure having 5 or more ring atoms, a monovalent group containing an aromatic heterocyclic structure having 5 or more ring atoms, and the like.

Examples of the alicyclic structure having 5 or more ring atoms include:

monocyclic cycloalkane structures such as a cyclopentane structure, a cyclohexane structure, a cycloheptane structure, a cyclooctane structure, a cyclononane structure, a cyclodecane structure, and a cyclododecane structure;

monocyclic cycloalkene structures such as a cyclopentene structure, a cyclohexene structure, a cycloheptene structure, a cyclooctene structure, and a cyclodecene structure;

polycylic cycloalkane structures such as a nobornane structure, an adamantane structure, a tricyclodecane structure, and a tricyclododecane structure;

polycyclic cycloalkene structures such as a norbornene structure and a tricyclodecene structure; and the like.

Examples of the aliphatic heterocyclic structure having 5 or more ring atoms include:

lactone structures such as a hexanolactone structure and a nobornanelactone structure;

sultone structures such as a hexanosultone structure and a nobornanesultone structure;

oxygen atom-containing heterocyclic structure such as an oxacycloheptane structure and an oxanobornane structure;

nitrogen atom-containing heterocyclic structures such as an azacyclohexane structure and a diazabicyclooctane structure;

sulfur atom-containing heterocyclic structures such as a thiacyclohexane structure and a thianorbornane structure; and the like.

Examples of the aromatic ring structure having 5 or more ring atoms include:

a benzene structure, a naphthalene structure, a phenanthrene structure, an anthracene structure, and the like.

Examples of the aromatic heterocyclic structure having 5 or more ring atoms include:

oxygen atom-containing heterocyclic structures such as a furan structure, a pyran structure, and a benzopyran structure;

nitrogen atom-containing heterocyclic structures such as a pyridine structure, a pyrimidine structure, and an indole structure; and the like.

In the above formula (4), the lower limit of the number of ring atoms of the ring structure included in $R^{p1}$ is preferably 6, more preferably 8, still more preferably 9, and particularly preferably 10. The upper limit of the number of ring atoms is preferably 15, more preferably 14, still more preferably 13, and particularly preferably 12. When the number of ring atoms falls within the above range, the diffusion length of the acid (b1) can be more appropriately shortened, and as a result, the inhibitory ability of defects, the LWR performance, and the sensitivity can be further improved.

A part or all of hydrogen atoms included in the ring structure included in $R^{p1}$ may be substituted with a substituent. Examples of the substituent include: halogen atoms such as a fluorine atom, a chlorine atom, a bromine atom, and an iodine atom; a hydroxy group; a carboxy group; a cyano group; a nitro group; an alkoxy group; an alkoxycarbonyl group; an alkoxycarbonyloxy group; an acyl group; an acyloxy group; and the like. Of these, a hydroxy group is preferred.

$R^{p1}$ represents: preferably the monovalent group containing the alicyclic structure having 5 or more ring atoms, or the monovalent group containing the aliphatic heterocyclic structure having 5 or more ring atoms; more preferably a monovalent group containing an alicyclic structure having 9 or more ring atoms, or a monovalent group containing an aliphatic heterocyclic structure having 9 or more ring atoms; still more preferably an adamantyl group, a hydroxyadamantyl group, a norbornanelactone-yl group, a norbornanesultone-yl group, or a 5-oxo-4-oxatricyclo[4.3.1.1$^{3,8}$]undecan-yl group; and particularly preferably an adamantyl group.

Examples of the divalent linking group represented by $R^{p2}$ include a carbonyl group, an ether group, a carbonyloxy group, a sulfide group, a thiocarbonyl group, a sulfonyl group, a divalent hydrocarbon group, and the like. Of these, a carbonyloxy group, a sulfonyl group, an alkanediyl group, or a cycloalkanediyl group is preferred; a carbonyloxy group or a cycloalkanediyl group is more preferred; a carbonyloxy group or a norbornanediyl group is still more preferred; and a carbonyloxy group is particularly preferred.

The monovalent hydrocarbon group having 1 to 20 carbon atoms which may be represented by $R^{p3}$ or $R^{p4}$ is exemplified by an alkyl group having 1 to 20 carbon atoms, and the like. The monovalent fluorinated hydrocarbon group having 1 to 20 carbon atoms which may be represented by $R^{p3}$ or $R^{p4}$ is exemplified by a fluorinated alkyl group having 1 to 20 carbon atoms, and the like. $R^{p3}$ and $R^{p4}$ each independently represent: preferably a hydrogen atom, a fluorine atom, or a fluorinated alkyl group; more preferably a fluorine atom or a perfluoroalkyl group; and still more preferably a fluorine atom or a trifluoromethyl group.

The monovalent fluorinated hydrocarbon group having 1 to 20 carbon atoms which may be represented by $R^{p5}$ or $R^{p6}$ is exemplified by a fluorinated alkyl group having 1 to 20 carbon atoms, and the like. $R^{p5}$ and $R^{p6}$ each represent: preferably a fluorine atom or a fluorinated alkyl group; more preferably a fluorine atom or a perfluoroalkyl group; still more preferably a fluorine atom or a trifluoromethyl group; and particularly preferably a fluorine atom.

In the above formula (4), $n^{p1}$ is preferably an integer of 0 to 5, more preferably an integer of 0 to 3, still more preferably an integer of 0 to 2, and particularly preferably 0 or 1.

$n^{p2}$ is preferably 0 to 5, more preferably 0 to 2, still more preferably 0 or 1, and particularly preferably 0.

$n^{p3}$ is preferably 1 to 5, more preferably 1 to 3, and still more preferably 1 or 2. When $n^{p3}$ falls within the above range, strength of the acid (b1) generated from the acid generating agent (B) can be increased, and as a result, the inhibitory ability of defects, the LWR performance, and the sensitivity of the radiation-sensitive resin composition (I) of the one embodiment of the present invention can be further improved.

The lower limit of the sum of $n^{p1}$, $n^{p2}$, and $n^{p3}$ is preferably 2, and more preferably 4. The upper limit of the sum of $n^{p1}$, $n^{p2}$, and $n^{p3}$ is preferably 20, and more preferably 10.

The acid generating agent (B) typically contains a radiation-sensitive cation, and an anion (hereinafter, may be also referred to as "anion (b')") being a conjugate base of the acid (b). The anion (b') is typically an anion obtained by removing a proton from an acid group contained in the acid (b). In a light-exposed region, the acid generating agent (B) gives the acid (b) from the anion (b') and a proton generated by decomposition of the radiation-sensitive cation by an action of a radioactive ray.

Examples of the anion (b') include a sulfonate anion, an imide anion, an amide anion, a methide anion, and the like.

The "radiation-sensitive cation" as referred to herein is a cation which is decomposed by irradiation with a radioactive ray. Referring to an example of an acid generating agent constituted from a sulfonate anion and a radiation-sensitive onium cation, a sulfonic acid is generated in a light-exposed region from the sulfonate anion and a proton generated by decomposition of the radiation-sensitive onium cation.

The radiation-sensitive onium cation is exemplified, as a monovalent cation, by cations (hereinafter, may be also referred to as "cations (T-1) to (T-3)") represented by the following formulae (T-1) to (T-3), and the like.

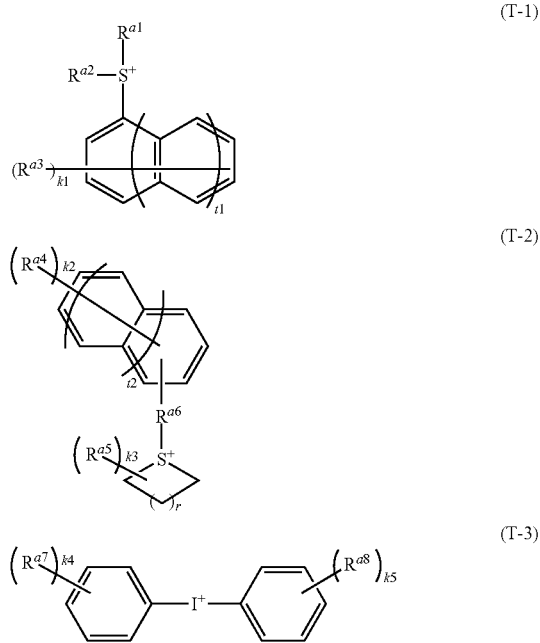

In the above formula (T-1) $R^{a1}$ and $R^{a2}$ each independently represent a monovalent organic group having 1 to 20 carbon atoms; k1 is an integer of 0 to 5, wherein in a case in which k1 is 1, $R^{a3}$ represents a hydroxy group, a nitro group, a halogen atom, or a monovalent organic group having 1 to 20 carbon atoms, and in a case in which k1 is no less than 2, a plurality of $R^{a3}$s are identical or different, and each $R^{a3}$ represents a hydroxy group, a nitro group, a halogen atom, or a monovalent organic group having 1 to 20 carbon atoms, or no less than two of the plurality of $R^{a3}$s taken together represent a ring structure having 4 to 20 ring atoms constituted together with the carbon chain to which the no less than two of the plurality of $R^{a3}$s bond; and t1 is an integer of 0 to 3.

Examples of the monovalent organic group having 1 to 20 carbon atoms which may be represented by $R^{a1}$, $R^{a2}$, or $R^{a3}$ include groups similar to the organic groups exemplified as $R^1$ in the above formula (1), and the like.

$R^{a1}$ and $R^{a2}$ each represent preferably a monovalent unsubstituted hydrocarbon group having 1 to 20 carbon atoms or a hydrocarbon group obtained therefrom by substituting with a substituent a hydrogen atom included therein; more preferably a monovalent unsubstituted aromatic hydrocarbon group having 6 to 18 carbon atoms or an aromatic hydrocarbon group obtained therefrom by substituting with a substituent a hydrogen atom included therein; and still more preferably a phenyl group.

The substituent which may substitute for the hydrogen atom included in the monovalent hydrocarbon group having 1 to 20 carbon atoms which may be represented by $R^{a1}$ or $R^{a2}$ is preferably —$OSO_2$—$R^k$, —$SO_2$—$R^K$, —$OR^k$, —CO—$OR^k$, —O—CO—$R^k$, —O—$R^{kk}$—$COOR^k$, —$R^{kk}$—CO—$R^k$, —S—$R^k$, or a substituted or unsubstituted monovalent hydrocarbon group having 1 to 20 carbon atoms, wherein $R^k$ represents a monovalent hydrocarbon group having 1 to 10 carbon atoms, and $R^k$ represents a single bond or a divalent hydrocarbon group having 1 to 10 carbon atoms.

$R^{a3}$ represents preferably —$OSO_2$—$R^k$, —$SO_2$—$R^K$, —$OR^k$, —$COOR^k$, —O—CO—$R^k$, —O—$R^{kk}$—$COOR^k$, —$R^{kk}$—CO—$R^k$, —S—$R^k$, or a substituted or unsubstituted monovalent hydrocarbon group having 1 to 20 carbon atoms, wherein $R^k$ represents a monovalent hydrocarbon group having 1 to 10 carbon atoms; and $R^k$ represents a single bond or a divalent hydrocarbon group having 1 to 10 carbon atoms.

In the above formula (T-2), k2 is an integer of 0 to 7, wherein in a case in which k2 is 1, $R^{a4}$ represents a hydroxy group, a nitro group, a halogen atom, or a monovalent organic group having 1 to 20 carbon atoms, and in a case in which k2 is no less than 2, a plurality of R's are identical or different, and each $R^{a4}$ represents a hydroxy group, a nitro group, a halogen atom, or a monovalent organic group having 1 to 20 carbon atoms, or no less than two of the plurality of the $R^{a5}$ taken together represent a ring structure having 4 to 20 ring atoms constituted together with the carbon chain to which the no less than two of the plurality of the $R^{a4}$s bond; k3 is an integer of 0 to 6, wherein in a case in which k3 is 1, $R^{a5}$ represents a hydroxy group, a nitro group, a halogen atom, or a monovalent organic group having 1 to 20 carbon atoms, and in a case in which k3 is no less than 2, a plurality of $R^{a5}$s are identical or different, and each $R^{a5}$ represents a hydroxy group, a nitro group, a halogen atom, or a monovalent organic group having 1 to 20 carbon atoms, or no less than two of the plurality of the $R^{a5}$s taken together represent a ring structure having 3 to 20 ring atoms constituted together with the carbon chain to which the no less than two of the plurality of the $R^{a5}$s bond; r is an integer of 0 to 3; $R^{a6}$ is a single bond or a divalent organic group having 1 to 20 carbon atoms; and t2 is an integer of 0 to 2.

$R^{a4}$ and $R^{a5}$ each represent preferably —$OR^k$, —$COOR^k$, —O—CO—$R^k$, —O—$R^k$—$COOR^k$, —$R^{kk}$—CO—$R^k$, or a substituted or unsubstituted monovalent hydrocarbon group having 1 to 20 carbon atoms, wherein $R^k$ represents a monovalent hydrocarbon group having 1 to 10 carbon atoms and $R^{kk}$ represents a single bond or a divalent hydrocarbon group having 1 to 10 carbon atoms.

In the above formula (T-3), k4 is an integer of 0 to 5, wherein in a case in which k4 is 1, $R^{a7}$ represents a hydroxy group, a nitro group, a halogen atom, or a monovalent organic group having 1 to 20 carbon atoms, and in a case in which k4 is no less than 2, a plurality of $R^{a7}$s are identical or different, and each $R^{a7}$ represents a hydroxy group, a nitro group, a halogen atom, or a monovalent organic group having 1 to 20 carbon atoms, or no less than two of the plurality of the $R^{a7}$s taken together represent a ring structure having 4 to 20 ring atoms constituted together with the carbon chain to which the no less than two of the plurality of the $R^{a7}$s bond; k5 is an integer of 0 to 5, wherein in a case in which k5 is 1, $R^{a8}$ represents a hydroxy group, a nitro group, a halogen atom, or a monovalent organic group having 1 to 20 carbon atoms, and in a case in which k5 is no less than 2, a plurality of $R^{a8}$s are identical or different, and each $R^{a8}$ represents a hydroxy group, a nitro group, a halogen atom, or a monovalent organic group having 1 to 20 carbon atoms, or no less than two of the plurality of the $R^{a8}$s taken together represent a ring structure having 4 to 20 ring atoms constituted together with the carbon chain to which the no less than two of the plurality of the $R^{a8}$s bond.

It is preferable that $R^{a7}$ and $R^{a8}$ each represent —OSO$_2$—$R^k$, —SO$_2$—$R^k$, —OR$^k$, —COOR$^k$, —O—CO—$R^k$, —O—$R^{kk}$—COOR$^k$, —$R^{kk}$—CO—$R^k$, —S—$R^k$, or a substituted or unsubstituted monovalent hydrocarbon group having 1 to 20 carbon atoms, or no less than two of $R^{a7}$ and $R^{a8}$ taken together represent a ring structure, wherein $R^k$ represents a monovalent hydrocarbon group having 1 to 10 carbon atoms, and $R^{kk}$ represents a single bond or a divalent hydrocarbon group having 1 to 10 carbon atoms.

Examples of the monovalent hydrocarbon group having 1 to 20 carbon atoms which may be represented by $R^{a3}$, $R^{a4}$, $R^{a5}$, $R^{a7}$ or $R^{a8}$ include groups similar to those exemplified as the hydrocarbon groups which may be represented by $R^1$ in the above formula (1), and the like.

Examples of the divalent organic group which may be represented by $R^{a6}$ include groups obtained by removing one hydrogen atom from the monovalent organic group having 1 to 20 carbon atoms exemplified as $R^1$ in the above formula (1), and the like.

Examples of the substituent which may substitute for a hydrogen atom included in the hydrocarbon group which may be represented by $R^{a3}$, $R^{a4}$, $R^{a5}$, $R^{a7}$, or $R^{a8}$ include halogen atoms such as a fluorine atom, a chlorine atom, a bromine atom, and an iodine atom; a hydroxy group; a carboxy group; a cyano group; a nitro group; an alkoxy group; an alkoxycarbonyl group; an alkoxycarbonyloxy group; an acyl group; an acyloxy group; and the like. Of these, the halogen atom is preferred, and a fluorine atom is more preferred.

$R^{a3}$, $R^{a4}$, $R^{a5}$, $R^{a7}$, and $R^{a8}$ each represent preferably an unsubstituted linear or branched monovalent alkyl group, a monovalent fluorinated alkyl group, an unsubstituted monovalent aromatic hydrocarbon group, —OSO$_2$—$R^k$, or —SO$_2$—$R^k$; more preferably a fluorinated alkyl group or an unsubstituted monovalent aromatic hydrocarbon group; and still more preferably a fluorinated alkyl group.

k1 in the above formula (T-1) is preferably an integer of 0 to 2, more preferably 0 or 1, and still more preferably 0. t1 is preferably 0 or 1, and more preferably 0. k2 in the above formula (T-2) is preferably an integer of 0 to 2, more preferably 0 or 1, and still more preferably 0. k3 is preferably an integer of 0 to 2, more preferably 0 or 1, and still more preferably 0. r is preferably 2 or 3, and more preferably 2. t is preferably 0 or 1, and more preferably 0. k4 and k5 in the above formula (Z-3) are each preferably an integer of 0 to 2, more preferably 0 or 1, and still more preferably 0.

Of these, the radiation-sensitive onium cation is preferably the cation (T-1) or the cation (T-2), more preferably the cation (T-1), and still more preferably a triphenylsulfonium cation.

The lower limit of a content of the acid generating agent (B) with respect to 100 parts by mass of the polymer (A) is preferably 1 part by mass, more preferably 5 parts by mass, still more preferably 10 parts by mass, and particularly preferably 15 parts by mass. The upper limit of the content is preferably 50 parts by mass, more preferably 40 parts by mass, still more preferably 30 parts by mass, and particularly preferably 25 parts by mass. When the content of the acid generating agent (B) falls within the above range, the inhibitory ability of defects, the LWR performance, and the sensitivity can be further improved. The radiation-sensitive resin composition (I) may contain one, or two or more types of the acid generating agent (B).

(C) Acid Generating Agent

The acid generating agent (C) generates, by irradiation with a radioactive ray, a second acid (hereinafter, may be also referred to as "acid (c)") which does not substantially disassociate the acid-labile group (a) upon heating under a condition involving a temperature of no less than 80° C. and no greater than 140° C. for a time period of 1 minute. The acid-labile group (a) of the polymer (A) is not substantially disassociated by an action of the acid (c), to be generated from the acid generating agent (C) in a light-exposed region by irradiation with a radioactive ray, even in a case of conducting heating, for example, post-exposure baking (PEB) or the like, for 1 minute at a temperature in a range of 80° C. to 140° C. In other words, the acid generating agent (C) functions as a highly functional acid diffusion control agent that traps the acid in a light-unexposed region, and does not trap the acid in a light-exposed region.

The acid (c) is exemplified by carboxylic acid and the like.

Examples of the carboxylic acid include compounds represented by the following formula (5), and the like.

$$R^\alpha\text{—COOH} \qquad (5)$$

In the above formula (5), $R^\alpha$ represents a monovalent organic group having 1 to 30 carbon atoms.

Examples of the monovalent organic group having 1 to 30 carbon atoms represented by $R^\alpha$ include groups similar to those exemplified as the monovalent organic group which may be represented by $R^1$ in the above formula (1), and the like.

$R^\alpha$ is preferably a substituted or unsubstituted aryl group or a carbonyloxy hydrocarbon group, more preferably a substituted aryl group or a carbonyloxy alicyclic hydrocarbon group, and still more preferably a hydroxyphenyl group or an adamantan-1-yl oxycarbonyl group.

The acid generating agent (C) typically contains a radiation-sensitive cation, and an anion (hereinafter, may be also referred to as "anion (c')") being a conjugate base of the acid (c). The anion (c') is an anion obtained by removing a proton from an acid group contained in the acid (c). The acid generating agent (C) may have a betaine structure in which a carboxylate group or the like derived from the anion (c') bonds to a hydrocarbon group or the like included in the radiation-sensitive cation.

In a light-exposed region, the acid generating agent (C) gives: the acid (c) from the anion (c'); and a proton generated by decomposition of the radiation-sensitive cation due to an action of a radioactive ray. The acid (c) does not substantially disassociate the acid-labile group (a) of the polymer (A) upon heating under a condition involving a temperature of no less than 80° C. and no greater than 140° C. for a time period of 1 minute. Accordingly, the acid generating agent (C) functions as an acid diffusion control agent in the resist film.

Examples of the anion (c') include a carboxylate anion and the like.

Examples of the radiation-sensitive cation of the acid generating agent (C) include cations similar to those exemplified as the radiation-sensitive cation of the acid generating agent (B), and the like.

The lower limit of a content of the acid generating agent (C) with respect to 100 mol % of the acid generating agent (B) is preferably 0.1 mol %, more preferably 0.5 mol %, still more preferably 1 mol %, and particularly preferably 2 mol %. The upper limit of the content is preferably 50 mol %, more preferably 30 mol %, still more preferably 15 mol %, and particularly preferably 10 mol %.

The lower limit of the content of the acid generating agent (C) with respect to 100 parts by mass of the polymer (A) is preferably 0.02 parts by mass, more preferably 0.1 parts by mass, still more preferably 0.2 parts by mass, and particularly preferably 0.4 parts by mass. The upper limit of the content is preferably 10 parts by mass, more preferably 6 parts by mass, still more preferably 3 parts by mass, and particularly preferably 2 parts by mass.

When the content of the acid generating agent (C) falls within the above range, the inhibitory ability of defects, the LWR performance, and the sensitivity can be further improved. The radiation-sensitive resin composition (I) may contain one, or two or more types of the acid generating agent (C).

(D) Solvent

The radiation-sensitive resin composition (I) typically contains the solvent (D). The organic solvent (D) is not particularly limited as long as it is a solvent capable of dissolving or dispersing at least the polymer (A), the acid generating agent (B), and the agent generating agent (C), as well as the other optional component(s).

The solvent (D) is exemplified by an alcohol solvent, an ether solvent, a ketone solvent, an amide solvent, an ester solvent, a hydrocarbon solvent, and the like.

Examples of the alcohol solvent include:

aliphatic monohydric alcohol solvents having 1 to 18 carbon atoms such as 4-methyl-2-pentanol and n-hexanol;

alicyclic monohydric alcohol solvents having 3 to 18 carbon atoms such as cyclohexanol;

polyhydric alcohol solvents having 2 to 18 carbon atoms such as propylene glycol;

polyhydric alcohol partial ether solvents having 3 to 19 carbon atoms such as propylene glycol monomethyl ether; and the like.

Examples of the ether solvent include:

dialkyl ether solvents having 4 to 14 carbon atoms such as diethyl ether;

cyclic ether solvents such as tetrahydrofuran and tetrahydropyran;

aromatic ring-containing ether solvents such as diphenyl ether and anisole; and the like.

Examples of the ketone solvent include:

chain ketone solvents having 3 to 12 carbon atoms such as acetone, methyl ethyl ketone, methyl iso-butyl ketone, and 2-heptanone;

cyclic ketone solvents such as cyclopentanone, cyclohexanone, cycloheptanone, cyclooctanone, and methylcyclohexanone;

2,4-pentanedione, acetonylacetone, and acetophenone; and the like.

Examples of the amide solvent include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide, and N-methylpropionamide; and the like.

Examples of the ester solvent include:

monocarboxylic acid ester solvents, e.g., acetic acid ester solvents such n-butyl acetate and amyl acetate, and propionic acid ester solvents such as ethyl propionate;

hydrocarboxylic acid ester solvents such as ethyl lactate and n-butyl glycolate;

polyhydric alcohol carboxylate solvents such as propylene glycol acetate;

polyhydric alcohol partial ether carboxylate solvents such as propylene glycol monomethyl ether acetate;

polyhydric carboxylic acid diester solvents such as diethyl oxalate;

lactone solvents such as γ-butyrolactone and δ-valerolactone;

carbonate solvents such as dimethyl carbonate, diethyl carbonate, ethylene carbonate, and propylene carbonate; and the like.

Examples of the hydrocarbon solvent include:

aliphatic hydrocarbon solvents having 5 to 12 carbon atoms such as n-heptane and n-hexane;

aromatic hydrocarbon solvents having 6 to 16 carbon atoms such as toluene and xylene; and the like.

The solvent (D) is preferably the ester solvent or the ketone solvent, more preferably the polyhydric alcohol partial ether carboxylate solvent or the cyclic ketone solvent, and still more preferably propylene glycol monomethyl ether acetate and/or cyclohexanone. The radiation-sensitive resin composition (I) may contain one, or two or more types of the solvent (D).

Other Optional Component(s)

The other optional component(s) is/are exemplified by a surfactant, an alicyclic skeleton-containing compound, a sensitizing agent, and the like.

Production Method of Radiation-Sensitive Resin Composition (I)

The production method of the radiation-sensitive resin composition (I) of an other embodiment of the present invention includes:

a step of conducting living polymerization (hereinafter, may be also referred to as "polymerizing step") in a monomer composition containing a first monomer (monomer (i)) represented by the following formula (i), and a second monomer (monomer (ii)) represented by the following formula (ii) and including an acid-labile group; and a step of obtaining a mixture (hereinafter, may be also referred to as "mixing step") containing: the polymer (A) formed by the polymerizing step and having an Mw/Mn being less than 1.5: the acid generating agent (B); and the acid generating agent (C).

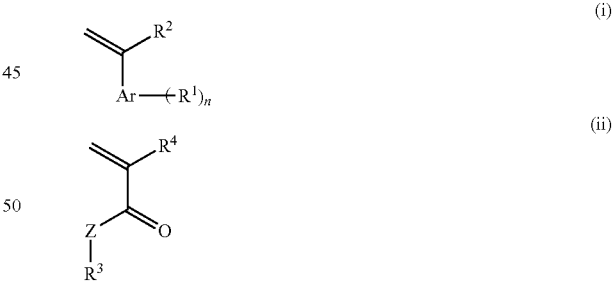

In the above formula (i), Ar represents a group obtained by removing (n+1) hydrogen atoms from an arene having 6 to 20 carbon atoms; $R^1$ represents a hydroxy group, a sulfanyl group, or a monovalent organic group having 1 to 20 carbon atoms; n is an integer of 0 to 11, wherein in a case in which n is no less than 2, a plurality of $R^1$s are identical or different; and $R^2$ represents a hydrogen atom, a fluorine atom, a methyl group, or a trifluoromethyl group.

In the above formula (ii), $R^3$ represents a monovalent group having 1 to 20 carbon atoms and including the acid-labile group; Z represents a single bond, an oxygen atom, or a sulfur atom; and $R^4$ represents a hydrogen atom, a fluorine atom, a methyl group, or a trifluoromethyl group.

The production method of the radiation-sensitive resin composition (I) of the other embodiment of the present invention enables the aforementioned radiation-sensitive resin composition (I) of the one embodiment of the present invention, being superior in the inhibitory ability of defects, the LWR performance, and the sensitivity, to be produced in a convenient and certain manner.

Ar, $R^1$, and $R^2$ in the above formula (i), and $R^3$, Z, and $R^4$ in the above formula (ii) are respectively exemplified by groups similar to those exemplified as Ar, $R^1$, and $R^2$ in the above formula (1) in the polymer (A), and as $R^3$, Z, and $R^4$ in the above formula (2) in the polymer (A).

Polymerizing Step

In this step, living polymerization is conducted in the monomer composition containing the monomer (i) and the monomer (ii).

The living polymerization may be conducted by a procedure described as the living polymerization in the synthesis procedure of the polymer (A), mentioned above, or the like.

In the case in which at least one $R^1$ in the above formula (1) in the polymer (A) represents a hydroxy group, the polymer (A) may be formed by: conducting living polymerization using, as the monomer (i), a monomer in which $R^1$ in the above formula (i) is an acyloxy group; and then generating a hydroxy group by allowing for a hydrolysis reaction of the acyloxy group of a resulting living polymerization product in the presence of a base such as triethylamine.

Mixing Step

In this step, a mixture containing the polymer (A) formed in the polymerizing step, the acid generating agent (B), and the acid generating agent (C) is obtained. A procedure of mixing each component in the mixing step is not particularly limited, and the polymer (A), the acid generating agent (B), and the acid generating agent (C) may be mixed at once; or two of the polymer (A), the acid generating agent (B), and the acid generating agent (C) may be mixed, and then a remaining component may be mixed into a resulting mixture. In addition to the polymer (A), the acid generating agent (B), and the acid generating agent (C), in the mixing, the solvent (D), and as necessary the other optional component(s), may be mixed in a predetermined ratio. A resulting mixture is preferably filtered through, e.g., a filter having a pore size of about 0.2 μm, or the like. The lower limit of a concentration of the radiation-sensitive resin composition (I) is preferably 0.1% by mass, more preferably 0.5% by mass, and still more preferably 1% by mass. The upper limit of the concentration is preferably 50% by mass, more preferably 30% by mass, and still more preferably 20% by mass.

Radiation-Sensitive Resin Composition (II)

The radiation-sensitive resin composition (II) contains the polymer (A'), the acid generating agent (B), and the acid generating agent (C). The radiation-sensitive resin composition (II) may contain, as a favorable component, the solvent (D), and may also contain, within a range not leading to impairment of the effects of the present invention, other optional component(s).

Due to containing the polymer (A'), the acid generating agent (B), and the acid generating agent (C), and to the polymer (A') being a living polymerization product, the radiation-sensitive resin composition (II) is superior in each of the inhibitory ability of defects, LWR performance, and sensitivity. The polymer (A') being a living polymerization product has already been described in the case in which the polymer (A) is a living polymerization product.

The radiation-sensitive resin composition (II) is similar to the radiation-sensitive resin composition (I) except that the polymer (A') is contained in place of the polymer (A). The radiation-sensitive resin composition (II) can be prepared similarly to the radiation-sensitive resin composition (I).

Resist Pattern-Forming Method

The resist pattern-forming method according to a still other embodiment of the present invention includes: a step of applying the radiation-sensitive resin composition of the one embodiment of the present invention directly or indirectly on a substrate (hereinafter, may be also referred to as "applying step"); a step of exposing a resist film formed by the applying step (hereinafter, may be also referred to as "exposing step"); and a step of developing the resist film exposed (hereinafter, may be also referred to as "developing step").

According to the resist pattern-forming method, formation of a resist pattern having favorable sensitivity, few defects, and low LWR is enabled due to use of the radiation-sensitive resin composition.

Applying Step

In this step, the radiation-sensitive resin composition (I) or (II) of the one embodiment of the present invention is applied directly or indirectly on the substrate. In other words, the radiation-sensitive resin composition is applied on the substrate directly or via another layer such as an organic underlayer film. The substrate is exemplified by a silicon wafer, a wafer coated with aluminum, and the like. By applying the radiation-sensitive resin composition on the substrate, a resist film is formed. A procedure for applying the radiation-sensitive resin composition is not particularly limited, and for example, a well-known procedure such as, e.g., spin-coating may be exemplified. In applying the radiation-sensitive resin composition, an amount of the radiation-sensitive resin composition applied is adjusted such that the resist film formed has a desired thickness. It is to be noted that after the radiation-sensitive resin composition is applied on the substrate, prebaking (hereinafter, may be also referred to as "PB") may be carried out to evaporate the solvent. The lower limit of a temperature of the PB is preferably 30° C., and more preferably 50° C. The upper limit of the temperature of the PB is preferably 200° C., and more preferably 150° C. The lower limit of a PB time period is preferably 10 sec, and more preferably 30 sec. The upper limit of the PB time period is preferably 600 sec, and more preferably 300 sec. The lower limit of an average thickness of the resist film is preferably 10 nm, more preferably 20 nm, and still more preferably 40 nm. The upper limit of the average thickness is preferably 1,000 nm, more preferably 200 nm, and still more preferably 100 nm.

In addition, in order to maximize potential abilities of the radiation-sensitive composition, an organic or inorganic antireflective film may be formed on the substrate to be used, as disclosed in, for example, Japanese Examined Patent Application, Publication No. H6-12452, Japanese Unexamined Patent Application, Publication No. S59-93448, and/or the like. Furthermore, in order to preclude influences from basic impurities and the like included in an environmental atmosphere, for example, a protective film may be provided on the resist film, as disclosed in Japanese Examined Patent Application, Publication No. H5-188598.

Exposing Step

In this step, the resist film formed by the applying step is exposed. The exposure may be carried out by irradiation with a radioactive ray through a mask having a predetermined pattern, and through a liquid for liquid immersion lithography such as water, as needed.

A liquid having a refractive index greater than that of air is typically used as the liquid for liquid immersion lithography. Specific examples of such a liquid include pure water, long chain or cyclic aliphatic compounds, and the like. The resist film is irradiated with the radioactive ray emitted from a lithography device through the liquid for liquid immersion lithography, i.e., with a space between a lens and the resist film being filled with the liquid for liquid immersion lithography, whereby the resist film is exposed through a mask having a predetermined pattern.

The radioactive ray may be appropriately selected in accordance with the type of the radiation-sensitive acid generating agent used, from among electromagnetic waves, e.g., visible light rays, ultraviolet rays, far ultraviolet rays such as an ArF excimer laser beam (wavelength: 193 nm) and a KrF excimer laser beam (wavelength: 248 nm), EUV (13.5 nm), X-rays, etc., and charged particle rays such as an electron beam and an α-ray, and the like. Of these, an ArF excimer laser beam, a KrF excimer laser beam, EUV, X-rays, and an electron beam are preferred, and an ArF excimer laser beam, EUV, and an electron beam are more preferred. It is to be noted that exposure conditions such as exposure dose and the like can be appropriately selected in accordance with a formulation of the radiation-sensitive resin composition, type(s) of additive(s), and the like.

The exposed resist film is preferably subjected to a baking treatment (hereinafter, may be also referred to as "post-exposure baking (PEB)"). The PEB enables the dissociation reaction of the acid-labile group included in the polymer (A) or the like to proceed smoothly. The baking conditions for the PEB may be appropriately adjusted in accordance with the formulation of the radiation-sensitive resin composition, and the lower limit of a temperature of the PEB is preferably 30° C., more preferably 50° C., still more preferably 70° C., and particularly preferably 80° C. The upper limit of the temperature of the PEB is preferably 200° C., more preferably 160° C., and still more preferably 140° C. The lower limit of a time period of the PEB is preferably 10 sec, more preferably 30 sec, and still more preferably 1 minute. The upper limit of the time period of the PEB is preferably 10 min, more preferably 5 min, and still more preferably 2 min.

Developing Step

In this step, the resist film exposed is developed. A developer solution used in the development is exemplified by an alkaline developer solution, an organic solvent developer solution, and the like. Accordingly, a predetermined resist pattern is formed.

Examples of the alkaline developer solution include alkaline aqueous solutions prepared by dissolving at least one alkaline compound such as sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, ethyldimethylamine, triethanolamine, tetramethylammonium hydroxide (TMAH), pyrrole, piperidine, choline, 1,8-diazabicyclo[5.4.0]-7-undecene, 1,5-diazabicyclo[4.3.0]-5-nonene, etc., and the like. Of these, an aqueous TMAH solution is preferred, and a 2.38% by mass aqueous TMAH solution is more preferred.

The organic solvent developer solution is exemplified by a hydrocarbon solvent, an ether solvent, an ester solvent, a ketone solvent, and an alcohol solvent; a solution containing an organic solvent; and the like. An exemplary organic solvent includes one, or two or more types of the solvents exemplified as the solvent (D) for the radiation-sensitive resin composition of the one embodiment of the present invention described above, and the like. Of these, the ester solvent or the ketone solvent is preferred. The ester solvent is preferably an acetic acid ester solvent, and more preferably amyl acetate or n-butyl acetate. The ketone solvent is preferably a chain ketone, and more preferably 2-heptanone. The lower limit of a content of the organic solvent in the organic solvent developer solution is preferably 80% by mass, more preferably 90% by mass, still more preferably 95% by mass, and particularly preferably 99% by mass. Examples of components other than the organic solvent in the organic solvent developer solution include water, silicone oil, and the like.

These developer solutions may be used either alone of one type, or in a combination of two or more types thereof. It is to be noted that after the development, washing with water and/or an alcohol solvent, and then drying is typical.

EXAMPLES

Hereinafter, the present invention is explained in detail by way of Examples, but the present invention is not in any way limited to these Examples. Physical property values in the Examples were measured as described below.

Weight Average Molecular Weight (Mw) and Number Average Molecular Weight (Mn)

Measurements were carried out by gel permeation chromatography (GPC) using GPC columns manufactured by Tosoh Corporation ("G2000 HXL"×2, "G3000 HXL"×1, and "G4000 HXL"×1) under an analytical condition involving: a flow rate of 1.0 mL/min; an elution solvent of tetrahydrofuran; a sample concentration of 1.0% by mass; an injected sample amount of 100 µL; a column temperature of 40° C.; and a differential refractometer as a detector, with mono-dispersed polystyrene as a standard. Furthermore, a dispersity index (Mw/Mn) was calculated according to measurement results of the Mw and the Mn.

Synthesis of (A) Polymer

Monomers used for synthesizing the polymer (A) are presented below.

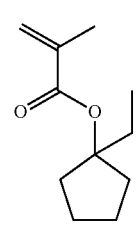

(M-1)

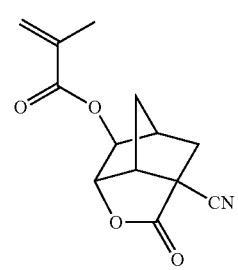

(M-2)

(M-3)

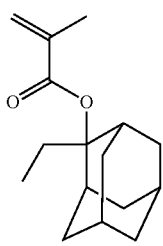

(M-4)

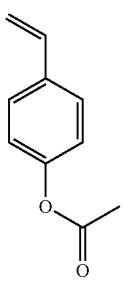

(M-5)

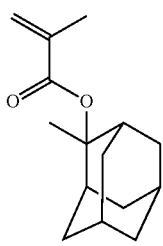

(M-6)

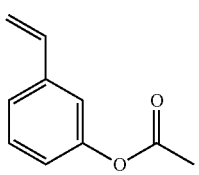

(M-7)

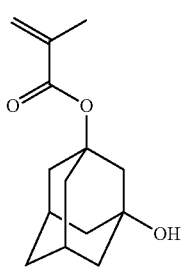

(M-8)

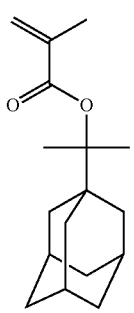

(M-9)

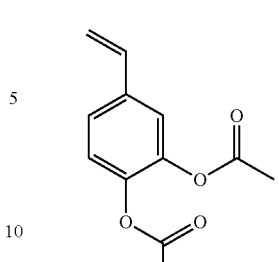

(M-10)

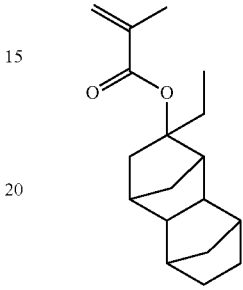

(M-11)

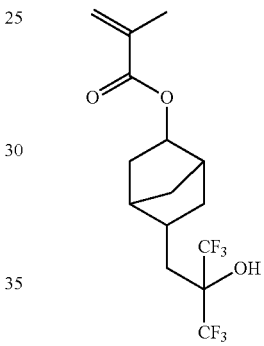

In the Examples, unless otherwise specified particularly, a numerical value for "parts by mass" means a value, provided that a total mass of monomers used was 100 parts by mass.

Synthesis Example 1: Synthesis of Polymer (A-1)

The compound (M-5), the compound (M-6), and the compound (M-7) were dissolved in 1-methoxy-2-propanol (60 parts by mass) such that the molar ratio became 35/45/20. Next, a monomer solution was prepared by adding 2-cyano-2-propyldodecyl trithiocarbonate (3.5 mol % with respect to total monomers) as a chain transfer agent, and AIBN (0.7 mol % with respect to total monomers) as an initiator. A reaction vessel was purged with nitrogen for 30 min, and then the monomer solution was charged thereinto. Thereafter, the temperature was raised by heating to 80° C. with stirring, a time point at which the temperature of the polymerization liquid became 80° C. was regarded as the start time of the polymerization reaction, and the polymerization reaction was allowed for 6 hrs. After completion of the polymerization reaction, the polymerization reaction liquid was water-cooled to 30° C. or below. The cooled polymerization reaction liquid was charged into hexane (500 parts by mass with respect to 100 parts by mass of the polymerization reaction liquid), and a thus precipitated white powder was filtered off. The white powder obtained by filtration was washed twice with hexane (100 parts by mass with respect to the polymerization reaction liquid), followed by filtering off and dissolution in 1-methoxy-2-propanol (300 parts by mass). Next, methanol (500 parts by mass), trimethylamine (50 parts by mass), and ultra-pure water (10 parts by mass) were added to a resulting solution, and a hydrolysis reaction was performed at 70° C. for 6 hrs with stirring. After completion of the reaction, the remaining solvent was distilled away and a solid thus obtained was dissolved in acetone (100 parts by mass). A resulting solution was added dropwise into water (500 parts by mass) to permit coagulation of the polymer, a solid thus obtained was filtered off, and drying at 50° C. for 12 hrs gave a white powdery polymer (A-1).

Synthesis Examples 2 to 9: Synthesis of Polymer (A-2) to Polymer (A-9)

Polymers (A-2) to (A-9) were synthesized similarly to Synthesis Example 1 except that each monomer of the type and in the amount shown in Table 1 below was used.

Synthesis Example 10: Synthesis of Polymer (A-10)

Polymer (A-10) was synthesized similarly to Synthesis Example 2, except that the chain transfer agent used was changed to methyl 2-(dodecylthiocarbonothioylthio)-2-methylpropionate, and the initiator was changed to 2,2'-azobis(methyl isobutyrate).

Synthesis Example 11: Synthesis of Polymer (a-1)

The compound (M-5), the compound (M-6), and the compound (M-7) were dissolved in 1-methoxy-2-propanol (200 parts by mass with respect to total monomers) such that the molar ratio became 35/45/20. Next, a monomer solution was prepared by adding AIBN (5 mol % with respect to total monomers) as an initiator. After a reaction vessel was purged with nitrogen for 30 min, 1-methoxy-2-propanol (100 parts by mass with respect to total monomers) was charged thereinto, and the solution was heated to 80° C. with stirring. Next, the monomer solution prepared as described above was added dropwise over 3 hrs, and then a thus resulting solution was further heated for 3 hrs at 80° C., for a total polymerization reaction time of 6 hrs. After completion of the polymerization reaction, the polymerization reaction liquid was water-cooled to 30° C. or below. The cooled polymerization reaction liquid was charged into hexane (500 parts by mass with respect to the polymerization reaction liquid), and a thus precipitated white powder was filtered off. The white powder obtained by filtration was washed twice with hexane (100 parts by mass with respect to the polymerization reaction liquid), followed by filtering off and dissolution in 1-methoxy-2-propanol (300 parts by mass). Next, methanol (500 parts by mass), trimethylamine (50 parts by mass), and ultra-pure water (10 parts by mass) were added to a resulting solution, and a hydrolysis reaction was performed at 70° C. for 6 hrs with stirring. After completion of the reaction, the remaining solvent was distilled away and a solid thus obtained was dissolved in acetone (100 parts by mass). The solution was added dropwise into water (500 parts by mass) to permit coagulation of the polymer, a solid thus obtained was filtered off, and drying at 50° C. for 12 hrs gave a white powdery polymer (a-1).

Synthesis Examples 12 to 19: Synthesis of Polymer (a-2) to Polymer (a-9)

Polymers (a-2) to (a-9) were synthesized by a similar operation to that of Synthesis Example 11 except that each monomer of the type and in the amount shown in Table 2 below was used.

Synthesis Example 20: Synthesis of Polymer (a-10)

Polymer (a-10) was synthesized by a similar operation to that of Synthesis Example 11 except that each monomer of the type and in the amount shown in Table 2 below was used, and the initiator was changed to 2,2'-azobis(methyl isobutyrate).

TABLE 1

| | (A) Polymer | Monomer that gives structural unit (I) | | | Monomer that gives structural unit (II) | | | Monomer that gives structural unit (III) or other structural unit | | | Yield (%) | Mw | Mw/Mn |
|---|---|---|---|---|---|---|---|---|---|---|---|---|---|
| | | type | amount used (mol %) | proportion of structural unit (mol %) | type | amount used (mol %) | proportion of structural unit (mol %) | type | amount used (mol %) | proportion of structural unit (mol %) | | | |
| Synthesis Example 1 | A-1 | M-6 | 45 | 45.1 | M-5 | 35 | 34.2 | M-7 | 20 | 20.7 | 77 | 6,900 | 1.29 |
| Synthesis Example 2 | A-2 | M-6 | 20 | 20.0 | M-1 | 40 | 40.5 | M-2 | 30 | 29.7 | 78 | 6,800 | 1.27 |
| | | | | | M-8 | 10 | 9.8 | | | | | | |
| Synthesis Example 3 | A-3 | M-6 | 20 | 20.2 | M-1 | 30 | 30.5 | M-7 | 30 | 29.6 | 73 | 7,000 | 1.27 |
| | | | | | M-3 | 20 | 19.7 | | | | | | |
| Synthesis Example 4 | A-4 | M-9 | 50 | 53.4 | M-10 | 35 | 32.2 | M-7 | 15 | 14.4 | 76 | 6,900 | 1.28 |
| Synthesis Example 5 | A-5 | M-4 | 40 | 39.8 | M-1 | 60 | 60.2 | — | — | — | 78 | 6,800 | 1.28 |
| Synthesis Example 6 | A-6 | M-4 | 30 | 29.5 | M-1 | 50 | 50.2 | M-11 | 20 | 20.3 | 80 | 6,700 | 1.28 |
| Synthesis Example 7 | A-7 | M-4 | 30 | 30.2 | M-8 | 40 | 38.8 | M-11 | 30 | 31.0 | 78 | 7,000 | 1.28 |
| Synthesis Example 8 | A-8 | M-4 | 35 | 34.4 | M-1 | 50 | 50.3 | M-7 | 15 | 15.3 | 80 | 6,900 | 1.29 |
| Synthesis Example 9 | A-9 | M-4 | 40 | 40.2 | M-1 | 25 | 25.7 | M-7 | 20 | 21.9 | 79 | 6,800 | 1.29 |
| | | | | | M-10 | 15 | 12.2 | | | | | | |
| Synthesis Example 10 | A-10 | M-4 | 40 | 39.8 | M-1 | 60 | 60.2 | — | — | — | 79 | 6,900 | 1.29 |

TABLE 1-continued

| (A) Polymer | Monomer that gives structural unit (I) | | | Monomer that gives structural unit (II) | | | Monomer that gives structural unit (III) or other structural unit | | | Yield (%) | Mw | Mw/Mn |
|---|---|---|---|---|---|---|---|---|---|---|---|---|
| | type | amount used (mol %) | proportion of structural unit (mol %) | type | amount used (mol %) | proportion of structural unit (mol %) | type | amount used (mol %) | proportion of structural unit (mol %) | | | |
| Synthesis Example 11 | a-1 | M-6 | 45 | 45.1 | M-5 | 35 | 34.2 | M-7 | 20 | 20.7 | 70 | 6,800 | 1.55 |
| Synthesis Example 12 | a-2 | M-6 | 20 | 20.0 | M-1 M-8 | 40 10 | 40.5 9.8 | M-2 | 30 | 29.7 | 73 | 6,900 | 1.55 |
| Synthesis Example 13 | a-3 | M-6 | 20 | 20.2 | M-1 M-3 | 30 20 | 30.5 19.7 | M-7 | 30 | 29.6 | 72 | 7,000 | 1.52 |
| Synthesis Example 14 | a-4 | M-9 | 50 | 53.4 | M-10 | 35 | 32.2 | M-7 | 15 | 14.4 | 72 | 6,800 | 1.57 |
| Synthesis Example 15 | a-5 | M-4 | 40 | 39.8 | M-1 | 60 | 60.2 | — | — | — | 70 | 6,900 | 1.53 |
| Synthesis Example 16 | a-6 | M-4 | 30 | 29.5 | M-1 | 50 | 50.2 | M-11 | 20 | 20.3 | 71 | 6,900 | 1.54 |
| Synthesis Example 17 | a-7 | M-4 | 30 | 30.2 | M-8 | 40 | 38.8 | M-11 | 30 | 31.0 | 70 | 7,000 | 1.54 |
| Synthesis Example 18 | a-8 | M-4 | 35 | 34.4 | M-1 | 50 | 50.3 | M-7 | 15 | 15.3 | 69 | 6,900 | 1.55 |
| Synthesis Example 19 | a-9 | M-4 | 40 | 40.2 | M-1 M-10 | 25 15 | 25.7 12.2 | M-7 | 20 | 21.9 | 68 | 6,800 | 1.55 |
| Synthesis Example 20 | a-10 | M-4 | 40 | 39.8 | M-1 | 60 | 60.2 | — | — | — | 69 | 7,000 | 1.55 |

Preparation of Radiation-Sensitive Resin Composition

The acid generating agent (B), the acid generating agent (C), and the solvent (D) used in preparing each radiation-sensitive resin composition are shown below.

(B) Acid Generating Agent
Each structural formula is shown below.
B-1: triphenylsulfonium 2-(adamantan-1-ylcarbonyloxy)-1,1-3,3,3-pentafluoropropane-1-sulfonate
B-2: triphenylsulfonium norbornanesultone-2-yloxycarbonyldifluoromethanesulfonate
B-3: triphenylsulfonium 3-(piperidin-1-ylsulfonyl)-1,1,2,2,3,3-hexafluoropropane-1-sulfonate
B-4: triphenylsulfonium adamantan-1-yloxycarbonyldifluoromethanesulfonate

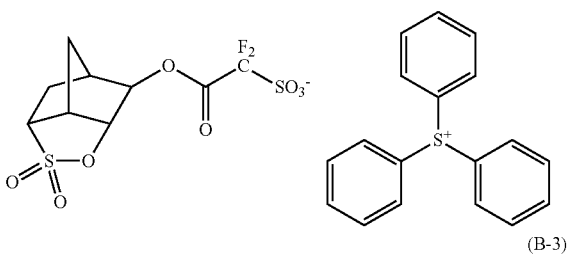

(B-2)

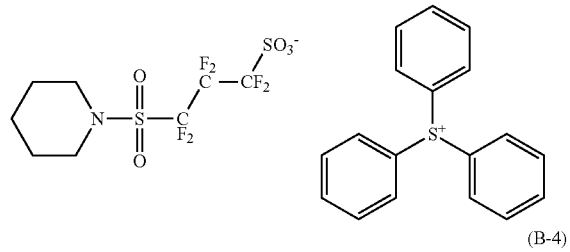

(B-3)

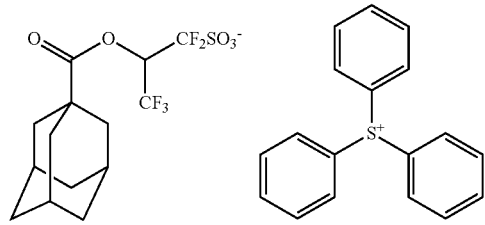

(B-1)

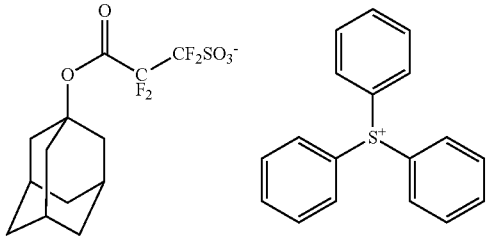

(B-4)

(C) Acid Generating Agent
Each structural formula is shown below.
C-1: triphenylsulfonium salicylate
C-2: triphenylsulfonium 1-adamantyl oxalate
CC-1: N-(n-undecan-1-ylcarbonyloxyethyl)morpholine

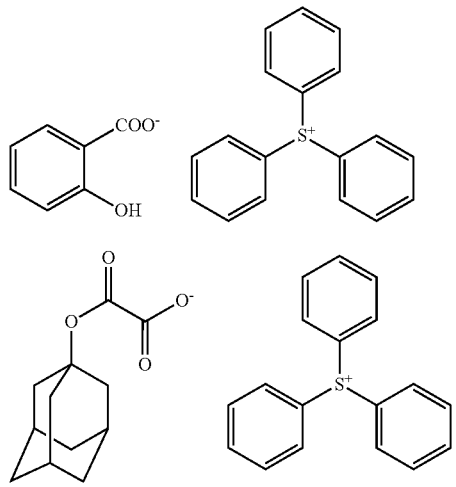

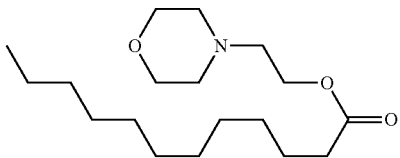

(D) Solvent
D-1: propylene glycol monomethyl ether acetate
D-2: cyclohexanone

Example 1

A radiation-sensitive resin composition (R-1) was prepared by: blending 100 parts by mass of (A-1) as the polymer (A), 20 parts by mass of (B-1) as the acid generating agent (B), 5 mol % (C-1) with respect to (B-1) as the acid generating agent (C), and 4,800 parts by mass of (D-1) and 2,000 parts by mass of (D-2) as the polymer (D).

Examples 2 to 14 and Comparative Examples 1 to 16

Radiation-sensitive resin compositions (R-2) to (R-14) and (CR-1) to (CR-16) were prepared in a similar manner to Example 1, except that for each component, the type and content shown in Table 2 below were used.

TABLE 2

|  | Radiation-sensitive resin composition | (A) Polymer | | (B) Acid generating agent | | (C) Acid generating agent | mol % with respect to (B) acid generating agent | (D) Solvent | |
|---|---|---|---|---|---|---|---|---|---|
|  |  | type | content (parts by by mass) | type | content (parts by by mass) | type |  | type | content (parts by by mass) |
| Example 1 | R-1 | A-1 | 100 | B-1 | 20 | C-1 | 5 | D-1/D-2 | 4,800/2,000 |
| Example 2 | R-2 | A-2 | 100 | B-1 | 20 | C-1 | 5 | D-1/D-2 | 4,800/2,000 |
| Example 3 | R-3 | A-3 | 100 | B-1 | 20 | C-1 | 5 | D-1/D-2 | 4,800/2,000 |
| Example 4 | R-4 | A-4 | 100 | B-1 | 20 | C-1 | 5 | D-1/D-2 | 4,800/2,000 |
| Example 5 | R-5 | A-5 | 100 | B-1 | 20 | C-1 | 5 | D-1/D-2 | 4,800/2,000 |
| Example 6 | R-6 | A-6 | 100 | B-1 | 20 | C-1 | 5 | D-1/D-2 | 4.800/2,000 |
| Example 7 | R-7 | A-7 | 100 | B-1 | 20 | C-1 | 5 | D-1/D-2 | 4,800/2,000 |
| Example 8 | R-8 | A-8 | 100 | B-1 | 20 | C-1 | 5 | D-1/D-2 | 4,800/2,000 |
| Example 9 | R-9 | A-9 | 100 | B-1 | 20 | C-1 | 5 | D-1/D-2 | 4,800/2,000 |
| Example 10 | R-10 | A-10 | 100 | B-1 | 20 | C-1 | 5 | D-1/D-2 | 4,800/2,000 |
| Example 11 | R-11 | A-1 | 100 | B-2 | 20 | C-1 | 5 | D-1/D-2 | 4,800/2,000 |
| Example 12 | R-12 | A-1 | 100 | B-3 | 20 | C-1 | 5 | D-1/D-2 | 4,800/2,000 |
| Example 13 | R-13 | A-1 | 100 | B-4 | 20 | C-1 | 5 | D-1/D-2 | 4,800/2,000 |
| Example 14 | R-14 | A-1 | 100 | B-1 | 20 | C-2 | 5 | D-1/D-2 | 4,800/2,000 |
| Comparative Example 1 | CR-1 | a-1 | 100 | B-1 | 20 | C-1 | 5 | D-1/D-2 | 4,800/2,000 |
| Comparative Example 2 | CR-2 | a-2 | 100 | B-1 | 20 | C-1 | 5 | D-1/D-2 | 4,800/2,000 |
| Comparative Example 3 | CR-3 | a-3 | 100 | B-1 | 20 | C-1 | 5 | D-1/D-2 | 4,800/2,000 |
| Comparative Example 4 | CR-4 | a-4 | 100 | B-1 | 20 | C-1 | 5 | D-1/D-2 | 4,800/2,000 |
| Comparative Example 5 | CR-5 | a-5 | 100 | B-1 | 20 | C-1 | 5 | D-1/D-2 | 4,800/2,000 |
| Comparative Example 6 | CR-6 | a-6 | 100 | B-1 | 20 | C-1 | 5 | D-1/D-2 | 4,800/2,000 |
| Comparative Example 7 | CR-7 | a-7 | 100 | B-1 | 20 | C-1 | 5 | D-1/D-2 | 4,800/2,000 |
| Comparative Example 8 | CR-8 | a-8 | 100 | B-1 | 20 | C-1 | 5 | D-1/D-2 | 4,800/2,000 |
| Comparative Example 9 | CR-9 | a-9 | 100 | B-1 | 20 | C-1 | 5 | D-1/D-2 | 4,800/2,000 |
| Comparative Example 10 | CR-10 | a-10 | 100 | B-1 | 20 | C-1 | 5 | D-1/D-2 | 4,800/2,000 |

TABLE 2-continued

| Radiation-sensitive resin composition | (A) Polymer | | (B) Acid generating agent | | (C) Acid generating agent | mol % with respect to (B) acid generating agent | (D) Solvent | |
|---|---|---|---|---|---|---|---|---|
| | type | content (parts by by mass) | type | content (parts by by mass) | type | | type | content (parts by by mass) |
| Comparative Example 11 | CR-11 | a-1 | 100 | B-2 | 20 | C-1 | 5 | D-1/D-2 | 4,800/2,000 |
| Comparative Example 12 | CR-12 | a-1 | 100 | B-3 | 20 | C-1 | 5 | D-1/D-2 | 4,800/2,000 |
| Comparative Example 13 | CR-13 | a-1 | 100 | B-4 | 20 | C-1 | 5 | D-1/D-2 | 4,800/2,000 |
| Comparative Example 14 | CR-14 | a-1 | 100 | B-1 | 20 | C-2 | 5 | D-1/D-2 | 4,800/2,000 |
| Comparative Example 15 | CR-15 | a-1 | 100 | B-1 | 20 | CC-1 | 5 | D-1/D-2 | 4,800/2,000 |
| Comparative Example 16 | CR-16 | A-1 | 100 | B-1 | 20 | CC-1 | 5 | D-1/D-2 | 4,800/2,000 |

Resist Pattern Formation

Using a spin coater ("CLEAN TRACK ACT12," available from Tokyo Electron Limited), the radiation-sensitive resin compositions prepared as described above were each applied on a surface of a 12-inch silicon wafer coated with AL412 (available from Brewer Science, Inc.) having an average thickness of 20 nm, and PB was conducted at 130° C. for 60 sec. Thereafter, by cooling at 23° C. for 30 sec, a resist film having an average thickness of 55 nm was formed. Next, the resist film was irradiated with EUV using an EUV scanner ("NXE3300", available from ASML Co., with NA of 0.33 under an illumination condition of Conventional s=0.89, and with a mask of imecDEFECT32FFR02). After the irradiating, PEB was conducted at 110° C. for 60 sec, followed by cooling at 23° C. for 60 sec. Thereafter, the resist film was developed at 23° C. for 30 sec by using a 2.38% by mass aqueous TMAH solution to form a positive-tone 32 nm line-and-space pattern.

Evaluations

The radiation-sensitive resin compositions prepared as described above were each evaluated on inhibitory ability of defects, sensitivity, and LWR performance in accordance with the following method. A scanning electron microscope ("CG-5000," available from Hitachi High-Technologies Corporation) was used for line measurement of the line-and-space patterns in the evaluations of the sensitivity and the LWR performance. The results of the evaluations are shown in Table 3 below.

Inhibitory Ability of Defects

Defect density (defects/cm$^2$) of each of the line-and-space patterns formed as described above was measured by inspecting defects using a defect inspection apparatus ("KLA2925," available from KLA-Tencor Corporation). The defect density being low indicates a favorable inhibitory ability of defects. The inhibitory ability of defects may be evaluated to be: "favorable" in a case resulting in no greater than 60 defects/cm$^2$; and "unfavorable" in a case resulting in greater than 60 defects/cm. ">500" in Comparative Examples 16 and 17 indicates a result exceeding the measurable range of the defect inspection apparatus.

Sensitivity

In the formation of the line-and-space pattern (LS), an exposure dose at which the 32 nm LS was formed was defined as the optimal exposure dose, and this optimum exposure dose was adopted as sensitivity (mJ/cm$^2$).

LWR Performance

The line-and-space patterns formed were observed from above the pattern using the aforementioned scanning electron microscope. Line widths were measured at 50 arbitrary points, and then a 3 Sigma value was determined from distribution of the measurements and defined as "LWR performance (nm)." The value being smaller reveals less linewidth variance, indicating better LWR performance. The LWR performance was evaluated to be: "favorable" in a case of being no greater than 3.2 nm; and "unfavorable" in a case of being greater than 3.2 nm.

TABLE 3

| | Radiation-sensitive resin composition | Inhibitory ability of defects (defects/cm$^2$) | Sensitivity (mJ/cm$^2$) | LWR performance (nm) |
|---|---|---|---|---|
| Example 1 | R-1 | 9 | 80 | 2.6 |
| Example 2 | R-2 | 8 | 92 | 2.8 |
| Example 3 | R-3 | 5 | 108 | 2.6 |
| Example 4 | R-4 | 10 | 84 | 2.5 |
| Example 5 | R-5 | 9 | 72 | 2.5 |
| Example 6 | R-6 | 12 | 106 | 2.7 |
| Example 7 | R-7 | 8 | 110 | 2.8 |
| Example 8 | R-8 | 10 | 101 | 3.1 |
| Example 9 | R-9 | 10 | 83 | 2.5 |
| Example 10 | R-10 | 8 | 71 | 2.5 |
| Example 11 | R-11 | 8 | 92 | 2.7 |
| Example 12 | R-12 | 6 | 86 | 3.2 |
| Example 13 | R-13 | 7 | 102 | 2.5 |
| Example 14 | R-14 | 6 | 98 | 2.8 |
| Comparative Example 1 | CR-1 | 75 | 82 | 3.5 |
| Comparative Example 2 | CR-2 | 102 | 95 | 3.7 |
| Comparative Example 3 | CR-3 | 70 | 111 | 3.5 |
| Comparative Example 4 | CR-4 | 89 | 89 | 3.6 |
| Comparative Example 5 | CR-5 | 110 | 76 | 3.7 |
| Comparative Example 6 | CR-6 | 164 | 110 | 3.7 |
| Comparative Example 7 | CR-7 | 98 | 112 | 3.7 |
| Comparative Example 8 | CR-8 | 132 | 103 | 3.9 |
| Comparative Example 9 | CR-9 | 128 | 86 | 3.5 |
| Comparative Example 10 | CR-10 | 90 | 73 | 3.5 |

TABLE 3-continued

| | Radiation-sensitive resin composition | Inhibitory ability of defects (defects/cm²) | Sensitivity (mJ/cm²) | LWR performance (nm) |
|---|---|---|---|---|
| Comparative Example 11 | CR-11 | 80 | 94 | 3.6 |
| Comparative Example 12 | CR-12 | 73 | 88 | 3.9 |
| Comparative Example 13 | CR-13 | 88 | 106 | 3.3 |
| Comparative Example 14 | CR-14 | 70 | 102 | 3.7 |
| Comparative Example 15 | CR-15 | >500 | 105 | 4.5 |
| Comparative Example 16 | CR-16 | >500 | 100 | 4.3 |

As is clear from the results shown in Table 3, for all of the radiation-sensitive resin compositions of the Examples, the LWR performance and the inhibitory ability of defects were favorable, and the sensitivity was improved when compared with the radiation-sensitive resin compositions of the Comparative Examples.

INDUSTRIAL APPLICABILITY

The radiation-sensitive aspect composition and the resist pattern-forming method of the embodiments of the present invention enable a resist pattern to be formed with improved sensitivity, few defects, and low LWR. The production method of a radiation-sensitive resin composition of the still other embodiment of the present invention enables the radiation-sensitive resin composition of the embodiments of the present invention to be produced in a convenient and certain manner. Therefore, these can be suitably used in manufacturing processes of semiconductor devices, in which further progress of miniaturization is expected in the future.

What is claimed is:

1. A radiation-sensitive resin composition comprising:
a polymer comprising a first structural unit represented by formula (1), and a second structural unit represented by formula (2) and comprising an acid-labile group;
a first acid generating agent which generates a first acid by irradiation with a radioactive ray; and
a second acid generating agent which generates a second acid by irradiation with a radioactive ray, wherein
the first acid, to be generated from the first acid generating agent, disassociates the acid-labile group in the polymer upon heating under a condition involving a temperature of no less than 80° C. and no greater than 140° C. for a time period of 1 minute,
the second acid, to be generated from the second acid generating agent, does not substantially disassociate the acid-labile group under condition,
the polymer is synthesized by a living radical polymerization, the living radical polymerization being reversible addition-fragmentation chain-transfer (RAFT) polymerization, atom transfer radical polymerization (ATRP), or nitroxide-mediated radical polymerization (NMP), the RAFT polymerization being carried out by using a reversible addition-fragmentation chain-transfer agent (RAFT agent) together with a radical polymerization initiator, the RAFT agent being at least one selected from the group consisting of a disulfide, a dithioester, a xanthate, a dithiocarbamate, and a trithiocarbonate, and a ratio (Mw/Mn) of a polystyrene-equivalent weight average molecular weight of the polymer to a polystyrene-equivalent number average molecular weight of the polymer as determined by gel permeation chromatography is less than 1.5,

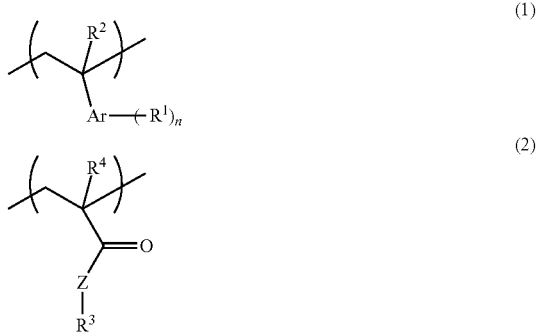

wherein,
in the formula (1), Ar represents a group obtained by removing (n+1) hydrogen atoms from an arene having 6 to 20 carbon atoms; $R^1$ represents a hydroxy group, a sulfanyl group, or a monovalent organic group having 1 to 20 carbon atoms; n is an integer of 0 to 11, wherein in a case in which n is no less than 2, a plurality of $R^1$s are identical or different; and $R^2$ represents a hydrogen atom, a fluorine atom, a methyl group, or a trifluoromethyl group, and
in the formula (2), $R^3$ represents a monovalent group having 1 to 20 carbon atoms and comprising the acid-labile group; Z represents a single bond, an oxygen atom, or a sulfur atom; and $R^4$ represents a hydrogen atom, a fluorine atom, a methyl group, or a trifluoromethyl group.

2. The radiation-sensitive resin composition according to claim 1, wherein the Mw/Mn of the polymer is less than 1.35.

3. The radiation-sensitive resin composition according to claim 1, wherein at least one $R^1$ in the formula (1) represents a hydroxy group.

4. A radiation-sensitive resin composition comprising:
a polymer comprising a first structural unit represented by formula (1), and a second structural unit represented by formula (2) and comprising an acid-labile group;
a first acid generating agent which generates a first acid by irradiation with a radioactive ray; and
a second acid generating agent which generates a second acid by irradiation with a radioactive ray, wherein
the first acid, to be generated from the first acid generating agent, disassociates the acid-labile group in the polymer upon heating under a condition involving a temperature of no less than 80° C. and no greater than 140° C. for a time period of 1 minute,
the second acid, to be generated from the second acid generating agent, does not substantially disassociate the acid-labile group under the condition, and
the polymer is synthesized by a living radical polymerization, the living radical polymerization being reversible addition-fragmentation chain-transfer (RAFT) polymerization, atom transfer radical polymerization (ATRP), or nitroxide-mediated radical polymerization (NMP), the RAFT polymerization being carried out by using a reversible addition-fragmentation chain-transfer agent (RAFT agent) together with a radical polymerization initiator, the RAFT agent being at least one selected from the group consisting of a disulfide, a dithioester, a xanthate, a dithiocarbamate, and a trithiocarbonate,

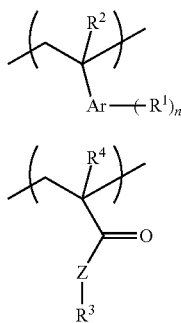

wherein, in the formula (1), Ar represents a group obtained by removing (n+1) hydrogen atoms from an arene having 6 to 20 carbon atoms; $R^1$ represents a hydroxy group, a sulfanyl group, or a monovalent organic group having 1 to 20 carbon atoms; n is an integer of 0 to 11, wherein in a case in which n is no less than 2, a plurality of $R^1$s are identical or different; and $R^2$ represents a hydrogen atom, a fluorine atom, a methyl group, or a trifluoromethyl group, and in the formula (2), $R^3$ represents a monovalent group having 1 to 20 carbon atoms and comprising the acid-labile group; Z represents a single bond, an oxygen atom, or a sulfur atom; and $R^4$ represents a hydrogen atom, a fluorine atom, a methyl group, or a trifluoromethyl group.

5. The radiation-sensitive resin composition according to claim 4, wherein at least one $R^1$ in the formula (1) represents a hydroxy group.

6. A resist pattern-forming method comprising:
applying the radiation-sensitive resin composition according to claim 1 directly or indirectly on a substrate to form a resist film;
exposing the resist film; and
developing the resist film exposed.

7. A method of producing the radiation-sensitive resin composition according to claim 4, the method comprising:
conducting the living radical polymerization in a monomer composition comprising a first monomer represented by formula (i), and a second monomer represented by formula (ii) and comprising an acid-labile group, to obtain a polymer; and
mixing the polymer, a first acid generating agent which generates a first acid by irradiation with a radioactive ray, and a second acid generating agent which generates a second acid by irradiation with a radioactive ray,
wherein
the first acid, to be generated from the first acid generating agent, disassociates the acid-labile group in the polymer upon heating under a condition involving a temperature of no less than 80° C. and no greater than 140° C. for a time period of 1 minute, and
the second acid, to be generated from the second acid generating agent, does not substantially disassociate the acid-labile group under the condition,

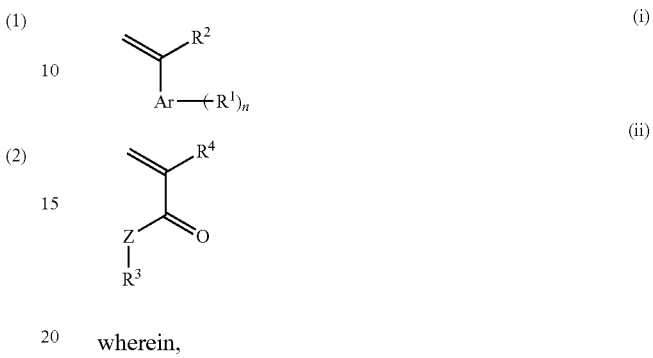

wherein, in the formula (i), Ar represents a group obtained by removing (n+1) hydrogen atoms from an arene having 6 to 20 carbon atoms; $R^1$ represents a hydroxy group, a sulfanyl group, or a monovalent organic group having 1 to 20 carbon atoms; n is an integer of 0 to 11, wherein in a case in which n is no less than 2, a plurality of $R^1$s are identical or different; and $R^2$ represents a hydrogen atom, a fluorine atom, a methyl group, or a trifluoromethyl group, and in the formula (ii), $R^3$ represents a monovalent group having 1 to 20 carbon atoms and comprising the acid-labile group; Z represents a single bond, an oxygen atom, or a sulfur atom; and $R^4$ represents a hydrogen atom, a fluorine atom, a methyl group, or a trifluoromethyl group.

8. The method according to claim 7, wherein a ratio (Mw/Mn) of a polystyrene-equivalent weight average molecular weight of the polymer to a polystyrene-equivalent number average molecular weight of the polymer as determined by gel permeation chromatography is less than 1.5.

9. The method according to claim 8, wherein the Mw/Mn of the polymer is less than 1.35.

10. The method according to claim 7, wherein at least one $R^1$ in the formula (i) represents a hydroxy group.

11. A resist pattern-forming method comprising:
applying the radiation-sensitive resin composition according to claim 4 directly or indirectly on a substrate to form a resist film;
exposing the resist film; and
developing the resist film exposed.

12. The method according to claim 11, wherein a ratio (Mw/Mn) of a polystyrene-equivalent weight average molecular weight of the polymer to a polystyrene-equivalent number average molecular weight of the polymer as determined by gel permeation chromatography is less than 1.5.

13. The resist pattern-forming method according to claim 12, wherein the Mw/Mn of the polymer is less than 1.35.

14. The resist pattern-forming method according to claim 11, wherein at least one $R^1$ in the formula (1) represents a hydroxy group.

* * * * *